(12) United States Patent
Miura et al.

(10) Patent No.: US 6,170,996 B1
(45) Date of Patent: Jan. 9, 2001

(54) OPTICAL MODULE ENCAPSULATED WITH RESIN AND MANUFACTURING METHOD THEREFOR

(75) Inventors: Kazunori Miura; Seimi Sasaki; Naoki Yamamoto, all of Kawasaki (JP)

(73) Assignee: Fujitsu Limited, Kawasaki (JP)

(*) Notice: Under 35 U.S.C. 154(b), the term of this patent shall be extended for 0 days.

(21) Appl. No.: 09/327,679

(22) Filed: Jun. 8, 1999

(30) Foreign Application Priority Data

Oct. 2, 1998 (JP) .................................................. 10-281045

(51) Int. Cl.[7] ........................................................ G02B 6/42
(52) U.S. Cl. ................................................ 385/94; 385/88
(58) Field of Search .................................. 385/14, 31, 39, 385/40, 51, 53, 88, 92, 94; 359/154, 173, 180, 188

(56) References Cited

U.S. PATENT DOCUMENTS

| | | | |
|---|---|---|---|
| 5,414,293 | * 5/1995 | Broom | 257/433 |
| 5,960,141 | * 9/1999 | Sasaki et al. | 385/88 |
| 6,019,523 | * 2/2000 | Honmou | 385/94 |
| 6,075,911 | * 6/2000 | Goto | 385/31 |

FOREIGN PATENT DOCUMENTS

| | | |
|---|---|---|
| 63-5310 | 1/1988 | (JP) . |
| 5-243444 | 9/1993 | (JP) . |
| 5-243445 | 9/1993 | (JP) . |
| 5-245853 | 9/1993 | (JP) . |
| 6-069604 | 3/1994 | (JP) . |
| 8-122588 | 5/1996 | (JP) . |
| 9-197196 | * 7/1997 | (JP) . |
| 10-123371 | * 5/1998 | (JP) . |
| 10-123372 | * 5/1998 | (JP) . |
| 10-221575 | * 8/1998 | (JP) . |

OTHER PUBLICATIONS

Terashima, T., "Plastic–package–type optoelectronic transmitter module resinous sealing", OFC'98, Technical Digest, pp. 193–194, Feb. 1998.*

* cited by examiner

*Primary Examiner*—John D. Lee
*Assistant Examiner*—Michelle R. Connelly-Cushwa
(74) *Attorney, Agent, or Firm*—Staas & Halsey LLP

(57) ABSTRACT

An optical module including a lead frame having a plurality of leads, a substrate mounted on the lead frame and having a plurality of conductive patterns, an optical element mounted on the substrate for making conversion between light and electricity, a sleeve placed on the substrate and having a front end adjacent to the optical element, and a first resin for encapsulating the optical element. The first resin has transparency to the light related to the optical element. The first resin is formed with a convex portion closing the front end of the sleeve. The conductive patterns of the substrate are connected through wires to the leads of the lead frame, respectively. The optical module further includes a molded second resin for enclosing all of the substrate, the optical element, the sleeve, the first resin, the wires, and the lead frame except a part of the sleeve and a part of each of the leads.

21 Claims, 27 Drawing Sheets

F I G. 4 A
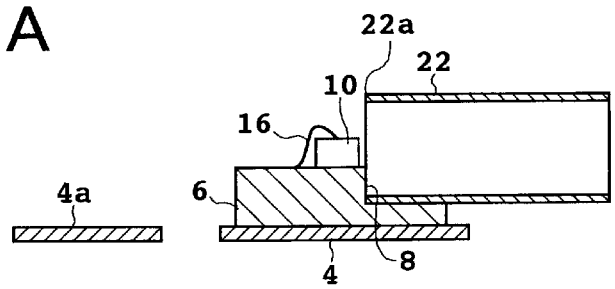
F I G. 4 B
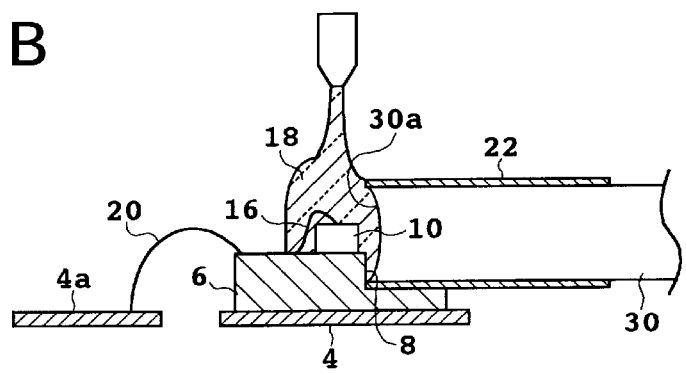
F I G. 4 C
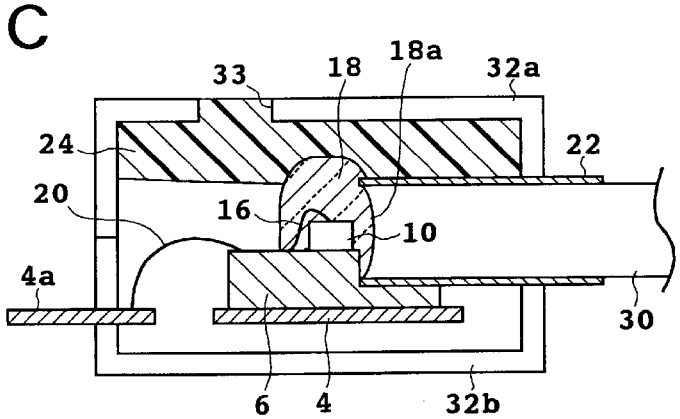
F I G. 4 D
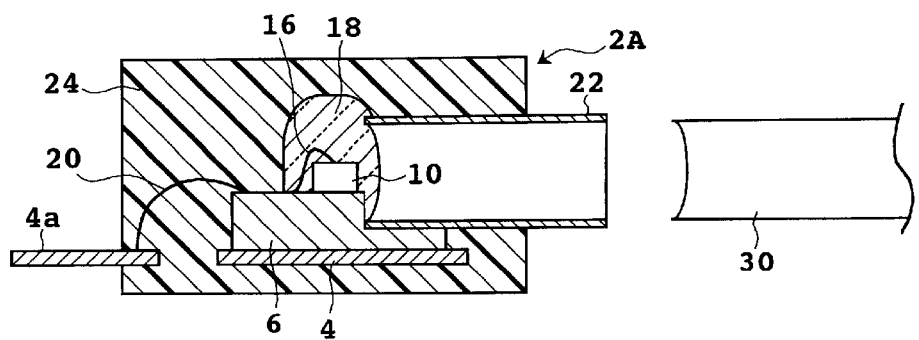

OPTICAL MODULE ENCAPSULATED WITH RESIN AND MANUFACTURING METHOD THEREFOR

BACKGROUND OF THE INVENTION

1. Field of the Invention

The present invention relates to an optical module and a manufacturing method therefor.

2. Description of the Related Art

In recent years, the development of an optical access network has been actively carried out. For realization of the optical access network, reducing the cost of an optical device and/or an optical module is a very important subject. Further, in encapsulating an optical element for making conversion from light to electricity or conversion from electricity to light, a further cost reduction is necessary, and it is required to realize an optical module which can simply encapsulate the optical element and can ensure a sufficient reliability.

In many optical modules at present, a metal package or a ceramic package is used to ensure reliability, and the package is hermetically sealed by welding or soldering, so that the cost of each optical module becomes very high. It is therefore an important subject for the cost reduction of an optical module to simplify an encapsulation method for an optical element. As an example of a method of simply hermetically sealing an optical module, there has been proposed a method including the steps of applying a resin to the entire surface of a substrate on which an optical element is mounted, and next curing the resin to hermetically seal the optical element (Mitsuo Fukuda et al., "Plastic Packaging of Semiconductor Laser Diode", Electronic Components and Conference, 1996, pp 1101–1108).

An optical module such as a light emitting module or a photodetecting module is required to be connected to an optical connector, so as to launch an optical signal to an optical fiber transmission line or to receive an optical signal from an optical fiber transmission line, and it is accordingly necessary to realize an optical module allowing the connection to the optical connector with a simple structure. However, in the case that a resin is applied to the entire surface of a substrate on which an optical element is mounted, and the resin is next cured to hermetically seal the optical element as described in the above literature, there is a possibility of separation of the resin from the substrate or generation of cracks or the like in the resin due to a difference in coefficient of linear expansion between the substrate and the resin. Furthermore, the substrate may be broken by a residual stress in the resin.

SUMMARY OF THE INVENTION

It is therefore an object of the present invention to provide a low-cost, high-reliability optical module which can be easily connected to an optical fiber transmission line.

It is another object of the present invention to provide a manufacturing method for a low-cost, high-reliability optical module.

In accordance with an aspect of the present invention, there is provided an optical module comprising a plurality of leads; a substrate having a plurality of conductive patterns electrically connected to the leads; an optical element mounted on the substrate for making conversion between light and electricity; a first resin for encapsulating the optical element, the first resin having transparency to the light; and a second resin for enclosing all of the leads, the substrate, the optical element, and the first resin except a part of each of the leads; the second resin being formed with a hole for receiving a ferrule, so as to optically couple an optical fiber inserted in the ferrule through the first resin to the optical element, the hole being closed by the first resin.

In accordance with another aspect of the present invention, there is provided an optical module comprising a plurality of leads; a substrate having a plurality of conductive patterns electrically connected to the leads; an optical element mounted on the substrate for making conversion between light and electricity; and a resin for enclosing the leads, the substrate, and the optical element except a part of each of the leads, the resin having transparency to the light; the resin being formed with a hole for receiving a ferrule, so as to optically couple an optical fiber inserted in the ferrule through the resin to the optical element.

In the optical module according to the present invention, all the components including the substrate are sealed with the molded resin, so that separation of the molded resin from the substrate can be prevented, and generation of cracks or the like in the molded resin can also be prevented, thereby ensuring the cost reduction and reliability of the optical module.

In accordance with a further aspect of the present invention, there is provided a manufacturing method for an optical module, comprising the steps of providing a lead frame having a plurality of leads; mounting a substrate having a plurality of conductive patterns on the lead frame; mounting an optical element for making conversion between light and electricity on the substrate; placing a sleeve having a front end on the substrate so that the front end is adjacent to the optical element; inserting a core having a front end into the sleeve until the front end of the core comes to the front end of the sleeve; applying a first resin in a liquid state to the optical element so as to fully cover the optical element, the first resin having transparency to the light; curing the first resin to encapsulate the optical element and close the front end of the sleeve; connecting the conductive patterns through a plurality of wires to the leads, respectively; providing a mold enclosing all of the substrate, the optical element, the sleeve, the first resin cured, the wires, and the lead frame except a part of the sleeve and a part of each of the leads; injecting a second resin in a liquid state into the mold to fill the mold with the second resin; curing the second resin; and removing the mold from the second resin cured and drawing the core out of the sleeve.

In accordance with a still further aspect of the present invention, there is provided a manufacturing method for an optical module, comprising the steps of providing a lead frame having a plurality of leads; mounting a substrate having a plurality of conductive patterns on the lead frame; mounting an optical element for making conversion between light and electricity on the substrate; placing a core having a front end on the substrate so that the front end of the core is adjacent to the optical element; applying a first resin in a liquid state to the optical element so as to fully cover the optical element, the first resin having transparency to the light; curing the first resin to encapsulate the optical element; connecting the conductive patterns through a plurality of wires to the leads, respectively; providing a mold enclosing all of the substrate, the optical element, the first resin cured, the wires, and the lead frame except a part of the core and a part of each of the leads; injecting a second resin in a liquid state into the mold to fill the mold with the second resin; curing the second resin; and removing the mold and the core from the second resin cured.

As a modification, a package having an upper opening may be used in place of the mold. In this case, the second resin is poured into the package from the upper opening, and is next cured to be integrated with the package, thereby eliminating the need for the step of removing the mold from the second resin cured.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 4A to 4D are sectional views showing a manufacturing process for the optical module according to the first preferred embodiment;

DETAILED DESCRIPTION OF THE PREFERRED EMBODIMENTS

Figure 1:
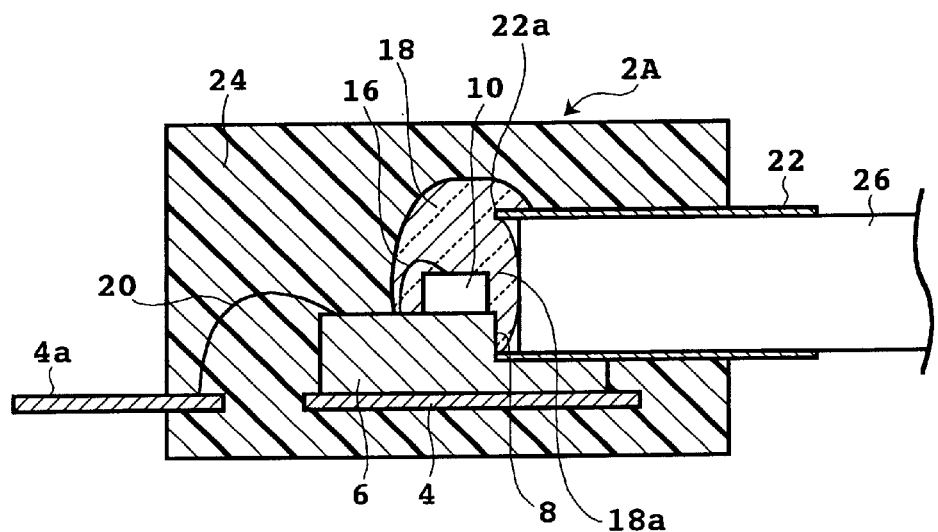
FIG. 1 is a sectional view of an optical module according to a first preferred embodiment of the present invention.

Various preferred embodiments of the present invention will now be described with reference to the drawings. In the following description of the preferred embodiments, substantially the same parts are denoted by the same reference numerals. Referring to FIG. 1, there is shown a sectional view of an optical module 2A according to a first preferred embodiment of the present invention. Reference numeral 4 denotes a lead frame having a plurality of leads 4a. A silicon substrate 6 is fixedly mounted on the lead frame 4 by adhesion or the like.

Figure 2:
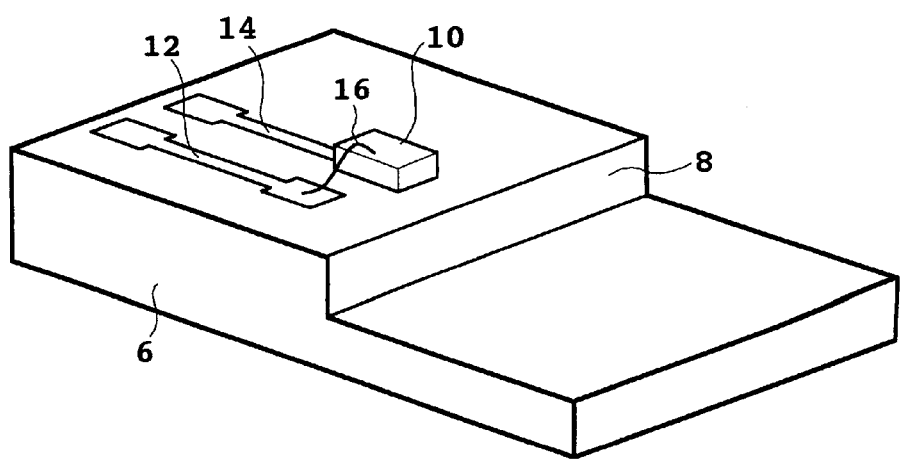
FIG. 2 is a perspective view of a substrate used in the optical module shown in FIG. 1.

The silicon substrate 6 has a vertical portion 8 as shown in FIG. 2. An optical element 10 for making conversion between light and electricity, such as a laser diode or a photodiode, is mounted on the silicon substrate 6. A pair of metal patterns 12 and 14 are formed on the silicon substrate 6. The metal pattern 12 is connected through a gold wire 16 to the optical element 10, and the metal pattern 14 is connected directly to the optical element 10. While the silicon substrate 6 is used in this preferred embodiment by way of example, any other substrates such as a semiconductor substrate, ceramic substrate, and glass substrate may be adopted.

The optical element 10 is encapsulated (sealed) in a transparent resin 18 having transparency to an optical signal to be transmitted or received by the optical element 10. The transparent resin 18 may be selected from any resins having a transparency of 90% or more to light having wavelengths in a 1.55 µm band, such as a silicone resin, polyimide resin, and epoxy resin. While a silicone resin is used as the transparent resin 18 in each preferred embodiment, any one of the other transparent resins satisfying the above condition may be used.

The silicone resin 18 is in contact with a front end 22a of a sleeve 22. The front end 22a of the sleeve 22 is in abutment against the vertical portion 8 of the substrate 6, thereby determining a positional relation to the optical element 10. The metal patterns 12 and 14 formed on the substrate 6 are connected through gold wires 20 to the leads 4a, respectively. All of the lead frame 4, the substrate 6, the silicone resin 18, and the sleeve 22 except a part of each of the leads 4a and a part of the sleeve 22 are covered with a molded resin 24. The resin 24 may be selected from an epoxy resin, phenol resin, PPS (polyphenyl sulfide), etc. While an epoxy resin is used as the resin 24 in each preferred embodiment, any one of the other moldable resins may be used.

A ferrule 26 for holding an optical fiber (not shown) of an optical connector (not shown) is inserted in the sleeve 22. In connecting the optical module 2A and the optical connector, the sleeve 22 serves to guide the ferrule 26 during insertion, and a convex portion 18a of the silicone resin 18 projecting into the sleeve 22 from its front end 22a serves as a stop for the ferrule 26 inserted into the sleeve 22. Accordingly, in the condition shown such that the ferrule 26 is inserted in the sleeve 22 so as to abut against the convex portion 18a of the silicone resin 18, the optical fiber inserted in the ferrule 26 is efficiently optically coupled through the silicone resin 18 to the optical element 10.

Figure 3A:
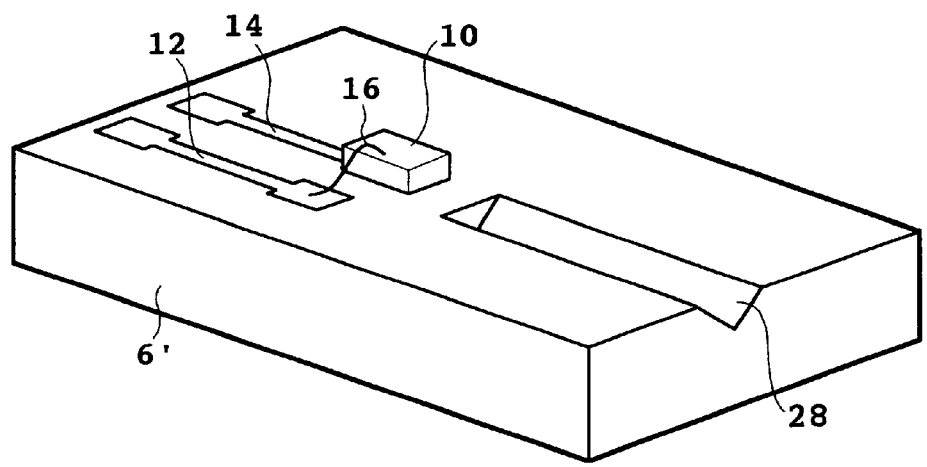
FIG. 3A is a perspective view of another preferred embodiment of the substrate.
Figure 3B:
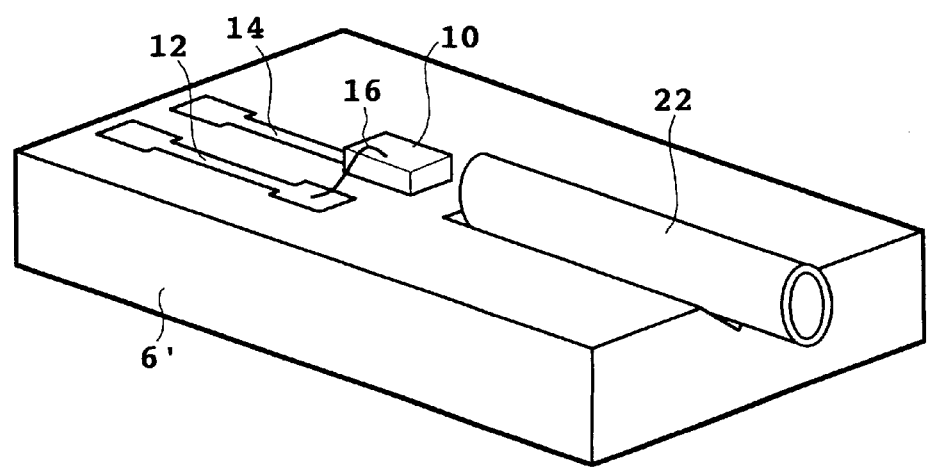
FIG. 3B is a perspective view similar to FIG. 3A, showing a condition that a sleeve is placed in a V groove formed on the substrate.

In the optical module 2A according to this preferred embodiment, the optical element 10 is encapsulated in the transparent silicone resin 18, and all the components of the optical module 2A are covered with the molded epoxy resin 24. Accordingly, it is possible to provide a low-cost, high-reliability optical module. While the substrate 6 having the vertical portion 8 is used in this preferred embodiment, a substrate 6' having a V groove 28 as shown in FIG. 3A may be used in place of the substrate 6. In the case of using the substrate 6', positioning of the sleeve 22 with respect to the optical element 10 can be easily achieved only by placing the sleeve 22 in the V groove 28 as shown in FIG. 3B.

A manufacturing process for the optical module 2A according to the first preferred embodiment will now be described with reference to FIGS. 4A to 4D. As shown in FIG. 4A, a silicon substrate 6 having a vertical portion 8 is fixedly mounted on a lead frame 4 having a plurality of leads 4a by means of an adhesive or the like. An optical element 10 for making conversion between light and electricity, such as a laser diode or a photodiode, is preliminarily mounted on the substrate 6. Metal patterns 12 and 14 are also preliminarily formed on the substrate 6, wherein the metal pattern 12 is preliminarily connected through a gold wire 16 to the optical element 10, and the metal pattern 14 is preliminarily connected directly to the optical element 10. Then, a sleeve 22 having a front end 22a is mounted on the substrate 6 and positioned to the optical element 10 in such a manner that the front end 22a abuts against the vertical portion 8 of the substrate 6.

As shown in FIG. 4B, a core 30 having a concave front end 30a is inserted into the sleeve 22 until the concave front end 30a abuts against the vertical portion 8 of the substrate 6. In this condition, a silicone resin 18 in a liquid state is dropped onto the optical element 10 so that the silicone resin 18 fully covers the optical element 10 and comes into contact with the concave front end 30a of the core 30. Then, the silicone resin 18 is heated to about 150° C. to about 160° C. for curing. As a result, a convex portion 18a of the cured silicone resin 18 is formed by the concave front end 30a of the core 30, and the optical element 10 is encapsulated in the cured silicone resin 18. Thereafter, the metal patterns 12 and 14 on the substrate 6 are connected by bonding through gold wires 20 to the leads 4a, respectively.

As shown in FIG. 4C, a mold 32 consisting of an upper member 32a and a lower member 32b is set so as to enclose all of the lead frame 4, the substrate 6, the silicone resin 18, and the sleeve 22 except a part of the sleeve 22 and a part of each of the leads 4a. At this time, it is preferable to preliminarily apply a releasing agent to the inner surface of the mold 32. In this condition, an epoxy resin 24 in a liquid state is injected into the mold 32 from an injection hole 33 formed through the upper member 32a. After filling the mold 32 with the epoxy resin 24, the epoxy resin 24 is heated to about 150° C. to about 160° C. for curing. After the epoxy resin 24 is fully cured, the mold 32 is removed from the epoxy resin 24 molded, and the core 30 is drawn out of the sleeve 22 as shown in FIG. 4D. Then, the leads 4a are cut off from an outer peripheral portion (not shown) of the lead frame 4 to thereby separate the leads 4a from each other. Thus, the optical module 2A is completed as shown in FIG. 4D wherein the optical element 10 is encapsulated in the silicone resin 18, and all the components are enclosed in the molded epoxy resin 24.

Figure 5:
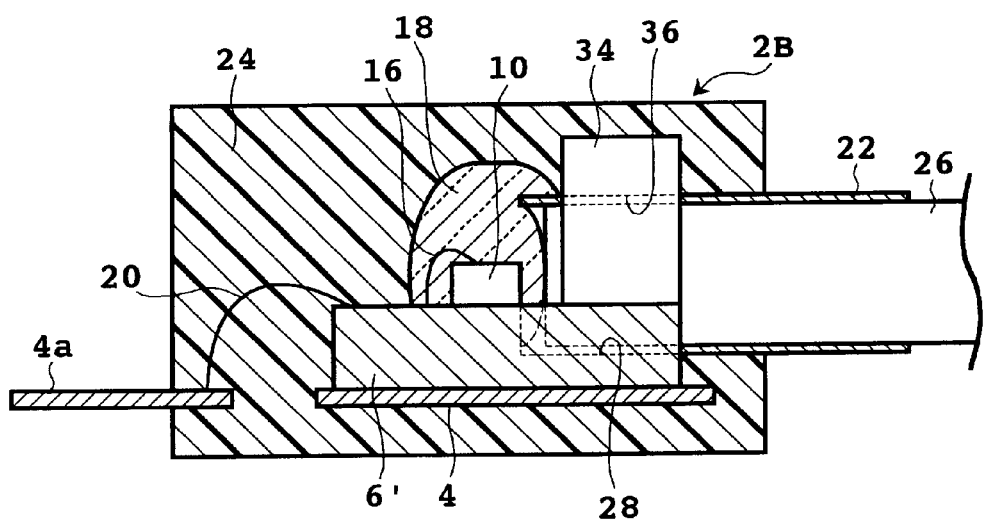
FIG. 5 is a sectional view of an optical module according to a second preferred embodiment of the present invention.
Figure 6:
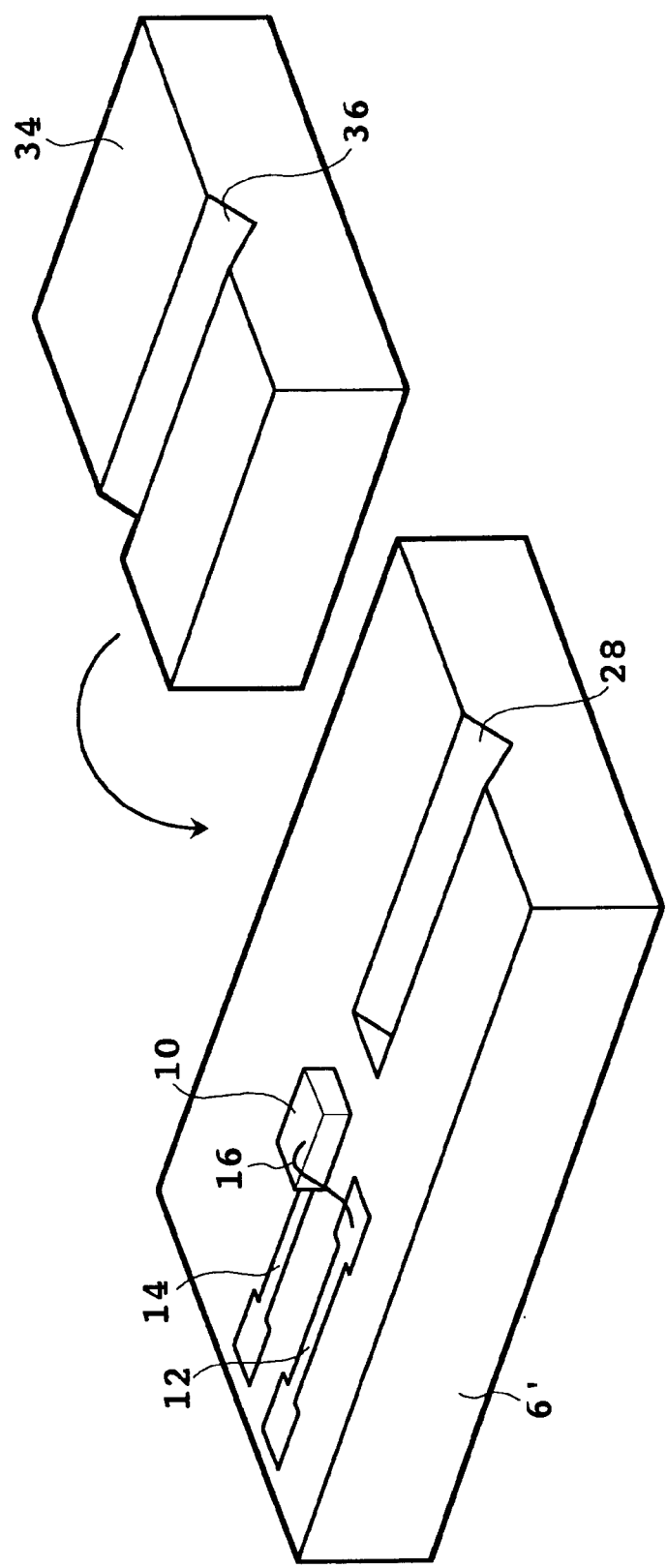
FIG. 6 is an exploded perspective view of a substrate and a block used in the optical module shown in FIG. 5.

Referring to FIG. 5, there is shown a sectional view of an optical module 2B according to a second preferred embodiment of the present invention. The optical module 2B in this preferred embodiment employs a silicon substrate 6' having a V groove 28 and a block 34 having a V groove 36 to be opposed to the V groove 28 as shown in FIG. 6. The block 34 is formed of silicon. In assembling the optical module 2B, a sleeve 22 is placed in the V groove 28 of the substrate 6', and the sleeve 22 is pressed from its upper side by the V groove 36 of the block 34. In this condition, the block 34 is fixed to the substrate 6' by an adhesive or the like. The other configuration of the optical module 2B according to this preferred embodiment is similar to that of the optical module 2A according to the first preferred embodiment. In the optical module 2B according to this preferred embodiment, the sleeve 22 is fixed to the substrate 6' by means of the block 34 having the V groove 36 similar to the substrate 6' having the V groove 28. Accordingly, the sleeve 22 can be positioned to the optical element 10 more reliably and fixed to the substrate 6' more firmly.

Figure 7:
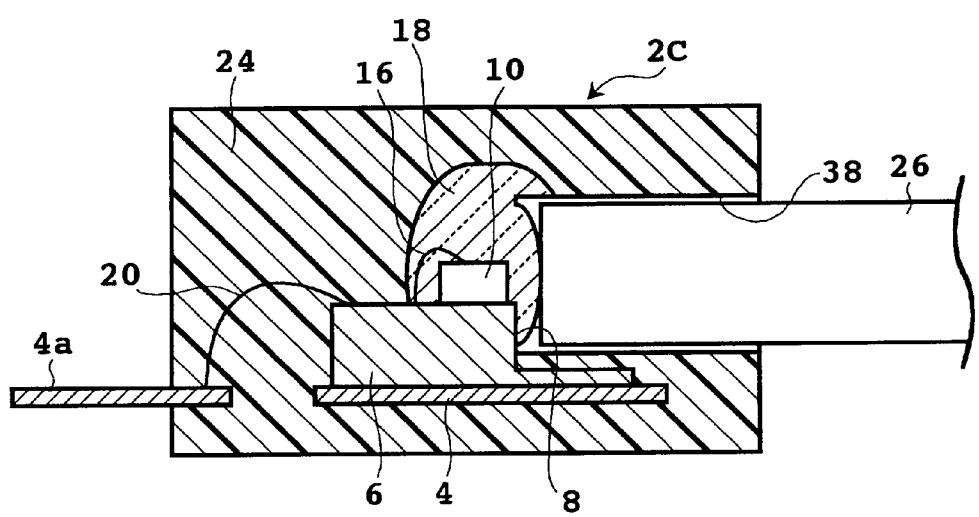
FIG. 7 is a sectional view of an optical module according to a third preferred embodiment of the present invention.

Referring to FIG. 7, there is shown a sectional view of an optical module 2C according to a third preferred embodiment of the present invention. The optical module 2C is configured by eliminating the sleeve 22 used in each of the first and second preferred embodiments and defining a guide hole 38 for guiding insertion of the ferrule 26 in a molded epoxy resin 24. Since the sleeve 22 is eliminated in this preferred embodiment, it is possible to provide a lower-cost optical module.

Figure 8:
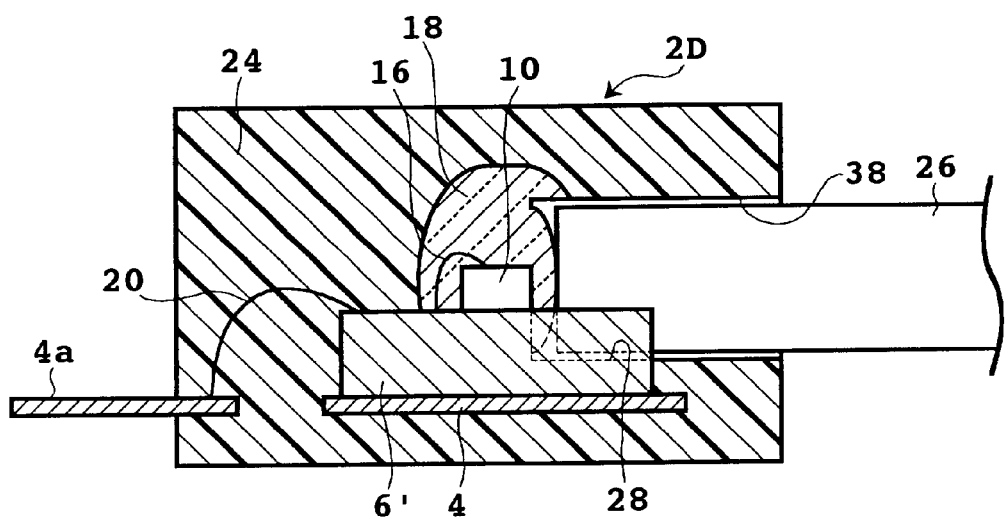
FIG. 8 is a sectional view of an optical module according to a fourth preferred embodiment of the present invention.

Referring to FIG. 8, there is shown a sectional view of an optical module 2D according to a fourth preferred embodiment of the present invention. The optical module 2D in this preferred embodiment is similar to the optical module 2C shown in FIG. 7, and differs therefrom in only the point that the optical module 2D employs a substrate 6' having a V groove 28. Also according to this preferred embodiment, the sleeve 22 used in each of the first and second preferred embodiments is eliminated, thereby contributing to the cost reduction of an optical module. A manufacturing process for the optical module 2D according to the fourth preferred embodiment will now be described with reference to FIGS. 9A to 9C.

Figure 9A:
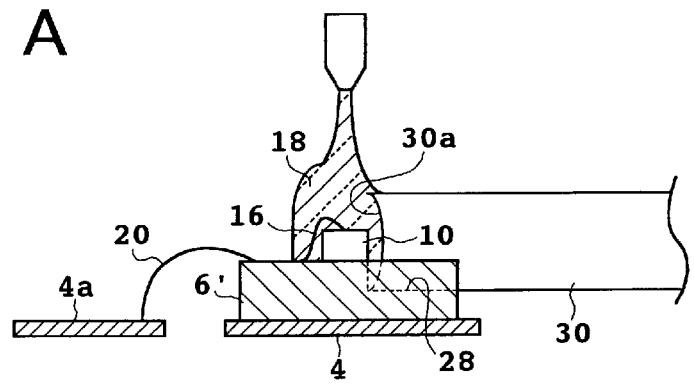
FIGS. 9A to 9C are sectional views showing a manufacturing process for the optical module according to the fourth preferred embodiment.
Figure 9B:
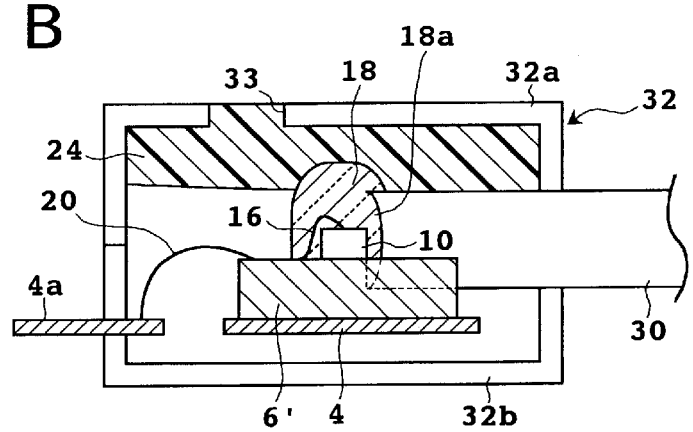

As shown in FIG. 9A, a core 30 having a concave front end 30a is placed in a V groove 28 of a substrate 6', and a silicone resin 18 in a liquid state is dropped onto an optical element 10 so as to fully cover the optical element 10 and come into contact with the concave front end 30a of the core 30. Then, the silicone resin 18 is heated to about 150° C. to about 160° C. for curing. As a result, a convex portion 18a of the cured silicone resin 18 is formed by the concave front end 30a of the core 30, and the optical element 10 is encapsulated in the cured silicone resin 18. Thereafter, the metal patterns 12 and 14 on the substrate 6' are connected by bonding through gold wires 20 to the leads 4a, respectively. As shown in FIG. 9B, a mold 32 consisting of an upper member 32a and a lower member 32b is set in such a manner that the core 30 is sandwiched between the upper member 32a and the lower member 32b. In this condition, an epoxy resin 24 in a liquid state is injected into the mold 32 from the injection hole 33.

Figure 9C:
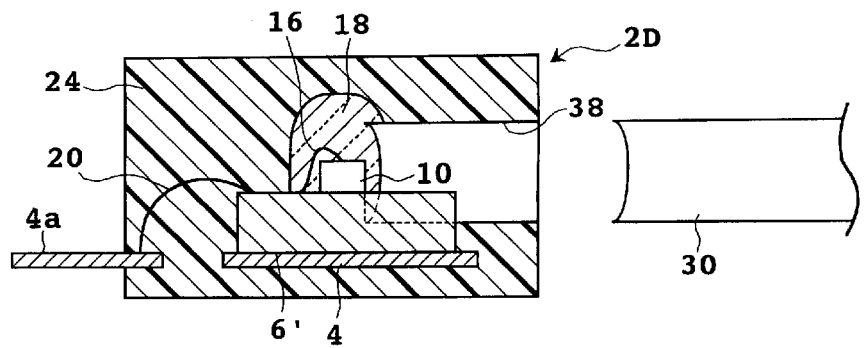

After filling the mold 32 with the epoxy resin 24, the epoxy resin 24 is heated to about 150° C. to about 160° C. for curing. After curing the epoxy resin 24, the mold 32 and the core 30 are removed from the molded epoxy resin 24 to define a guide hole 38 as shown in FIG. 9C. It is preferable to preliminarily apply a releasing agent to the outer surface of the core 30. Thus, the optical module 2D is completed as shown in FIG. 9C wherein the guide hole 38 is defined by the molded epoxy resin 24.

Figure 10:
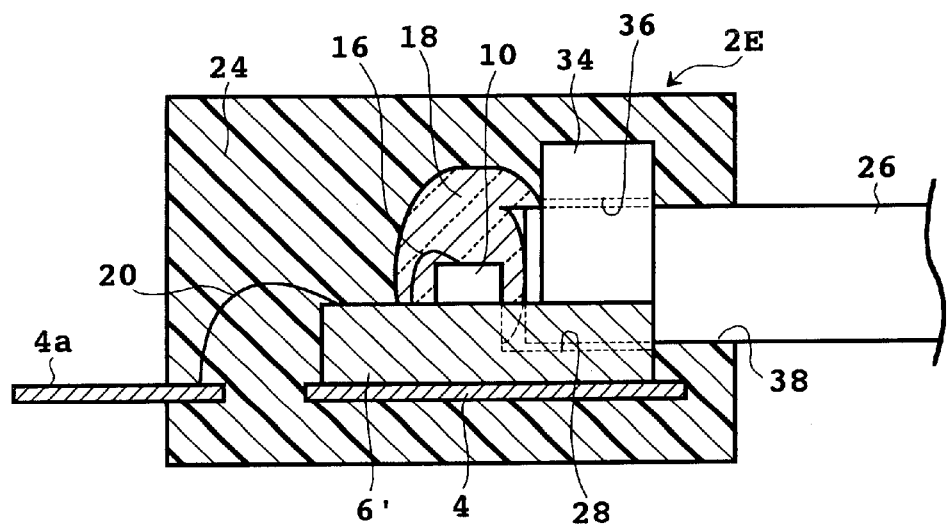
FIG. 10 is a sectional view of an optical module according to a fifth preferred embodiment of the present invention.

Referring to FIG. 10, there is shown a sectional view of an optical module 2E according to a fifth preferred embodiment of the present invention. In the optical module 2E, a guide hole 38 for guiding insertion of the ferrule 26 is defined by the V groove 28 of the substrate 6', the V groove 36 of the block 34, and the molded epoxy resin 24. The other configuration of this preferred embodiment is similar to that of the optical module 2D of the fourth preferred embodiment shown in FIG. 8.

Figure 11:
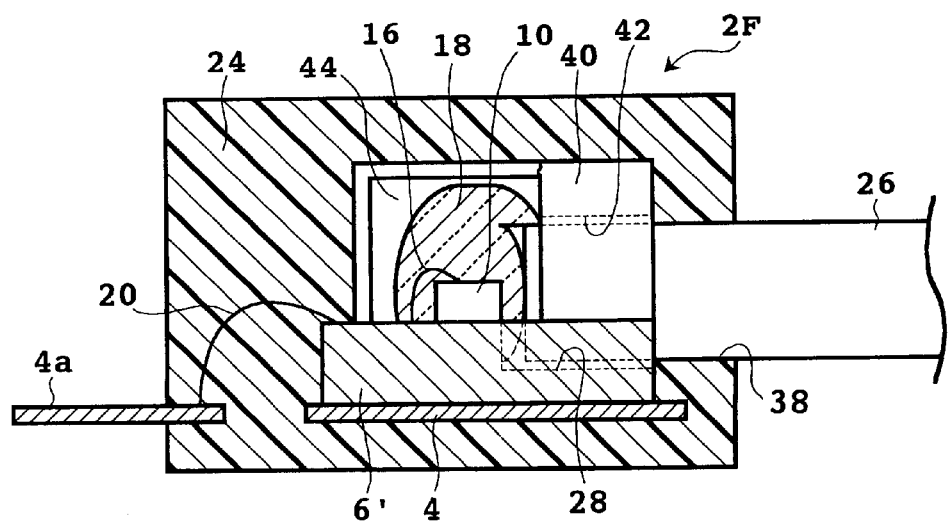
FIG. 11 is a sectional view of an optical module according to a sixth preferred embodiment of the present invention.
Figure 12:
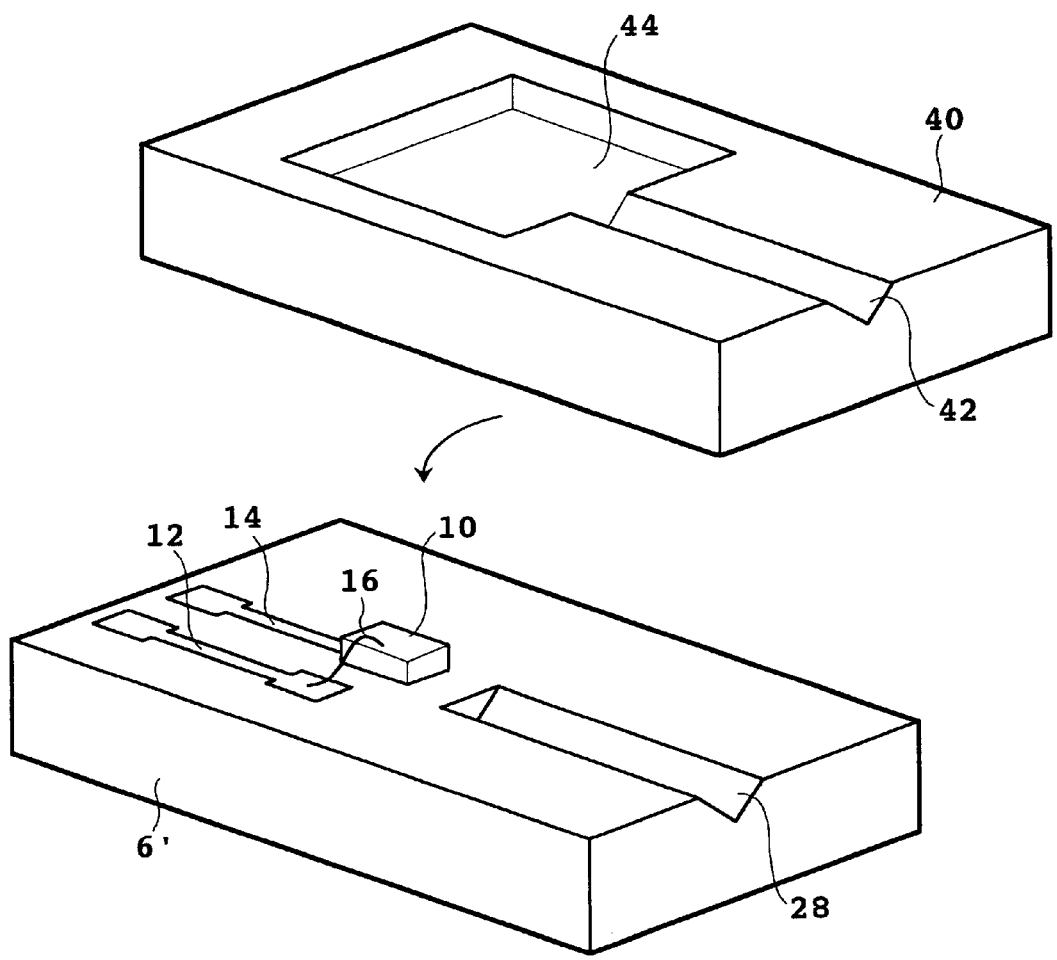
FIG. 12 is an exploded perspective view of a substrate and a cover used in the optical module shown in FIG. 11.

Referring to FIG. 11, there is shown a sectional view of an optical module 2F according to a sixth preferred embodiment of the present invention. The optical module 2F is characterized by the use of a cover 40 formed of silicon. As shown in FIG. 12, the cover 40 is formed with a V groove 42 to be opposed to the V groove 28 of the substrate 6' and a recess 44 for accommodating the optical element 10. The cover 40 is fixed to the substrate 6' so as to define an accommodation space for the optical element 10 by the recess 44 in cooperation with the substrate 6'. The other configuration of this preferred embodiment is similar to that of the optical module 2E shown in FIG. 10. Since the cured silicone resin 18 is relatively soft, there is a possibility that the injection of the epoxy resin 24 into the mold 32 may have an adverse effect on the optical element 10. In this respect, the cured silicone resin 18 is fully accommodated in the recess 44 of the cover 40 in this preferred embodiment to thereby prevent the above adverse effect on the optical element 10 due to the injection of the epoxy resin 24.

Figure 13:
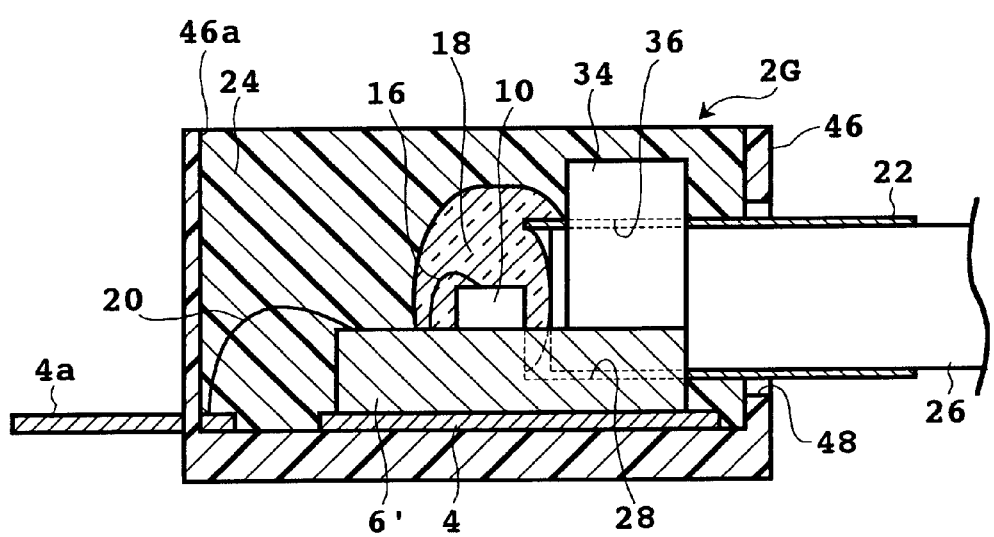
FIG. 13 is a sectional view of an optical module according to a seventh preferred embodiment of the present invention.

Referring to FIG. 13, there is shown a sectional view of an optical module 2G according to a seventh preferred embodiment of the present invention. The optical module 2G is characterized in that it employs a resin package 46 having an upper opening 46a and that an epoxy resin 24 is poured into the resin package 46 from the upper opening 46a and followed by curing of the epoxy resin 24. The resin package 46 may be replaced by a metal package having a similar structure.

Figure 14A:
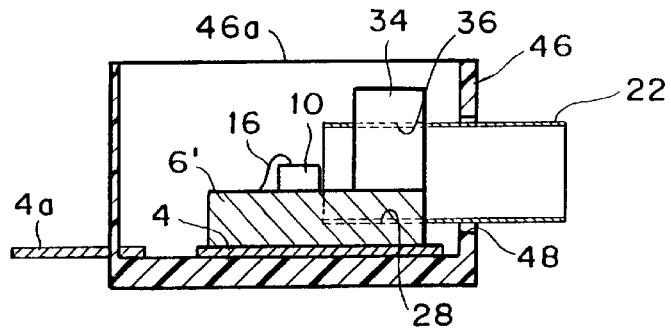
FIGS. 14A to 14D are sectional views showing a manufacturing process for the optical module according to the seventh preferred embodiment.

A manufacturing process for the optical module 2G shown in FIG. 13 will now be described with reference to FIGS. 14A to 14D. As shown in FIG. 14A, a lead frame 4 having a plurality of leads 4a is fixed by adhesion or the like in a resin package 46 having an upper opening 46a and a side opening 48 in such a manner that a part of each of the leads 4a is projected out of the resin package 46. A substrate 6' having a V groove 28 is preliminarily mounted on the lead frame 4, and an optical element 10 is preliminarily mounted on the substrate 6'. A sleeve 22 is inserted through the side opening 48 of the resin package 46, and is placed in the V groove 28 of the substrate 6'. In this condition, the sleeve 22 is pressed from its upper side by the V groove 36 of the block 34, and the block 34 is fixed to the substrate 6'.

Figure 14B:
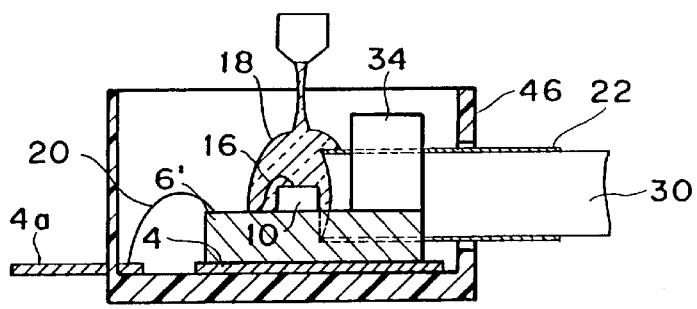
Figure 14C:
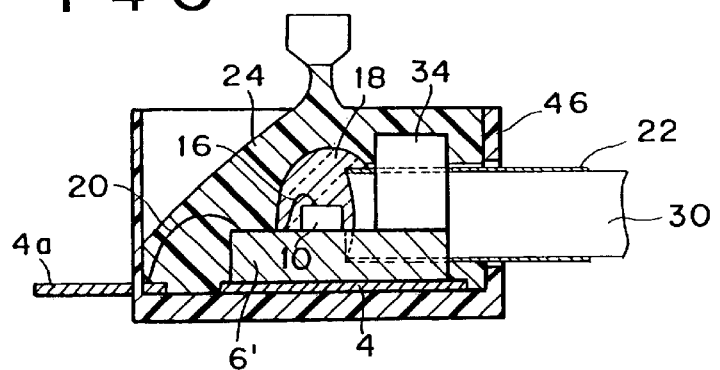
Figure 14D:
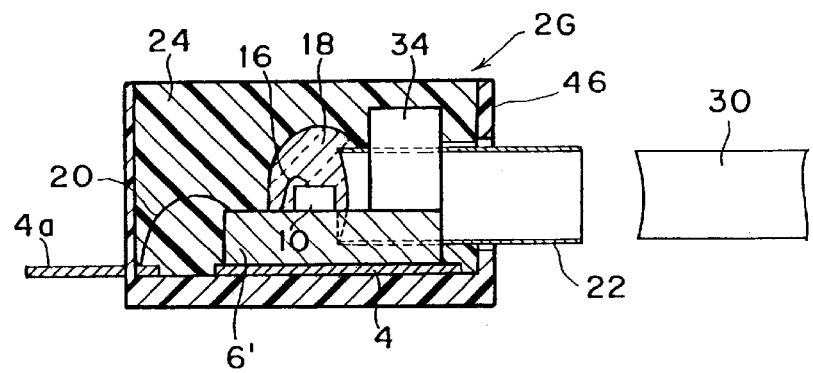

As shown in FIG. 14B, a core 30 is inserted into the sleeve 22, and a silicone resin 18 in a liquid state is dropped onto the optical element 10 so as to fully cover the optical element 10. Then, the silicone resin 18 is heated to about 150° C. to about 160° C. for curing, thereby encapsulating the optical element 10. As shown in FIG. 14C, an epoxy resin 24 in a liquid state is poured into the resin package 46 from the upper opening 46a to fill the inside space of the resin package 46. Then, the epoxy resin 24 is heated to about 150° C. to about 160° C. for curing. As a result, the resin package 46 and the cured epoxy resin 24 are integrated together. As shown in FIG. 14D, the core 30 is drawn out of the sleeve 22 to obtain the optical module 2G having a configuration such that the optical element 10 is encapsulated in the silicone resin 18 and that the resin package 46 and the epoxy resin 24 are integrated together.

Figure 15:
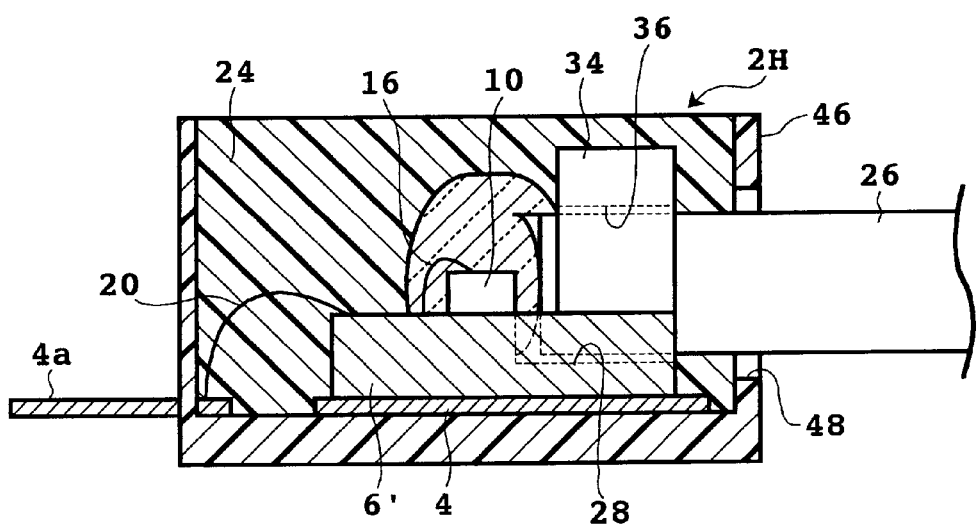
FIG. 15 is a sectional view of an optical module according to an eighth preferred embodiment of the present invention.

Referring to FIG. 15, there is shown a sectional view of an optical module 2H according to an eighth preferred embodiment of the present invention. The optical module 2H according to this preferred embodiment is similar to the optical module 2G according to the seventh preferred embodiment shown in FIG. 13, and differs therefrom in only the point that the sleeve 22 is eliminated.

Figure 16A:
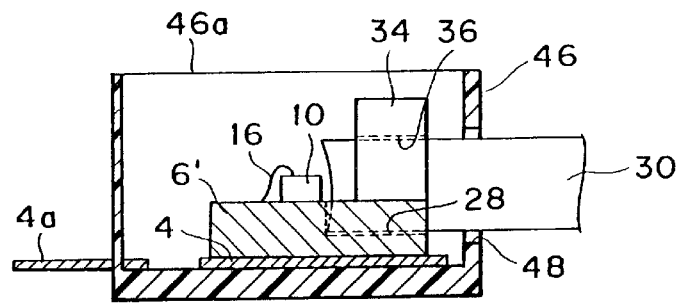
FIGS. 16A to 16D are sectional views showing a manufacturing process for the optical module according to the eighth preferred embodiment.
Figure 16B:
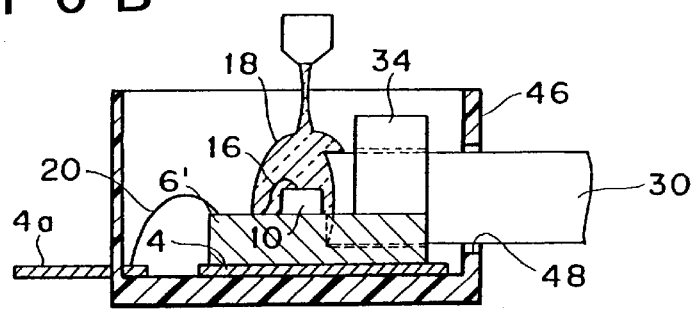

A manufacturing process for the optical module 2H according to the eighth preferred embodiment will now be described with reference to FIGS. 16A to 16D. As shown in FIG. 16A, a core 30 is inserted through a side opening 48 of a resin package 46, and is placed in a V groove 28 of a substrate 6'. Further, a block 34 having a V groove 36 is fixed to the substrate 6' so that the core 30 is sandwiched between the V groove 36 and the V groove 28. In this positioned condition of the core 30, a silicone resin 18 in a liquid state is dropped onto an optical element 10 so as to fully cover the optical element 10 as shown in FIG. 16B. Then, the silicone resin 18 is heated to about 150° C. to about 160° C. for curing. Accordingly, the optical element 10 is encapsulated in the cured silicone resin 18.

Figure 16C:
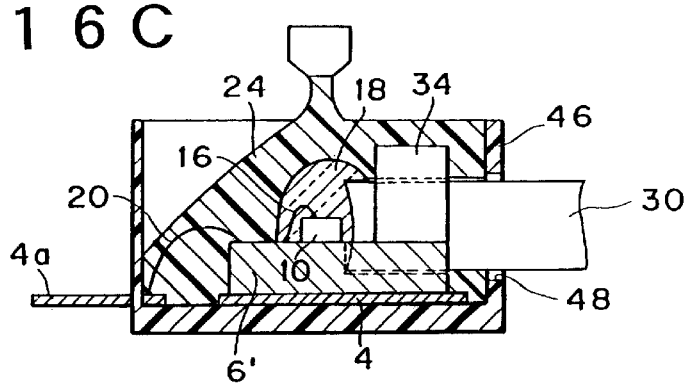
Figure 16D:
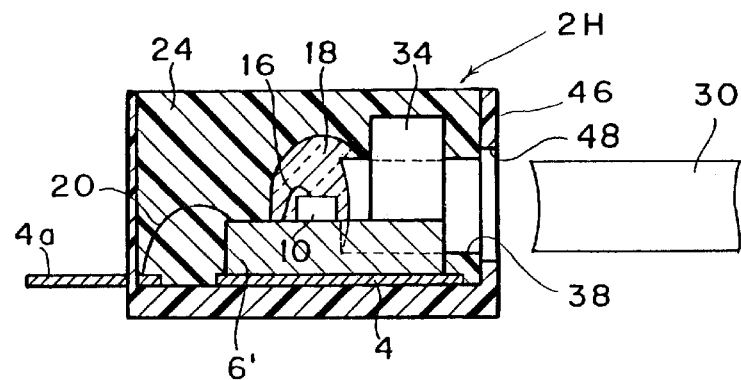

As shown in FIG. 16c, an epoxy resin 24 in a liquid state is poured into the resin package 46 from its upper opening 46a to fill the inside space of the resin package 46. In this condition, the epoxy resin 24 is heated to about 150° C. to about 160° C. for curing, so that the cured epoxy resin 24 is integrated with the resin package 46. As shown in FIG. 16D, the core 30 is drawn out of the cured epoxy resin 24 through the side opening 48 of the resin package 46. In this condition, a guide hole 38 for guiding insertion of the ferrule 26 is defined by the V groove 28 of the substrate 6', the V groove 36 of the block 34, and the cured epoxy resin 24.

According to each of the seventh and eighth preferred embodiments, the resin package 46 having the upper opening 46a is used to be filled with the liquid epoxy resin 24, which is then cured to be integrated with the resin package 46. Accordingly, it is unnecessary to carry out a mold releasing step for releasing a molded optical module from a mold as used in each of the first to sixth preferred embodiments.

Figure 17:
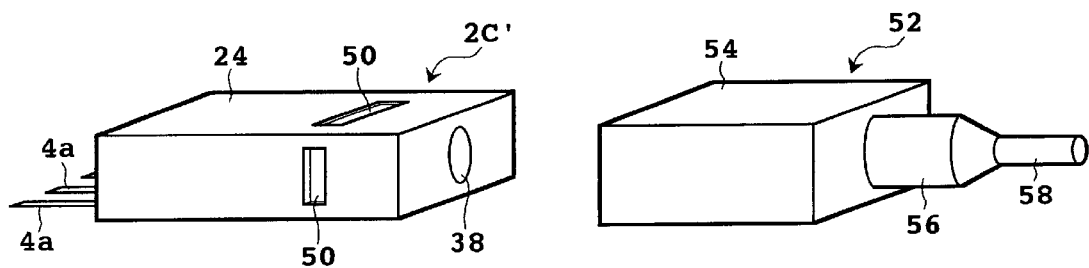
FIG. 17 is a perspective view showing a connection structure between an optical module according to the present invention and an optical connector.
Figure 18:
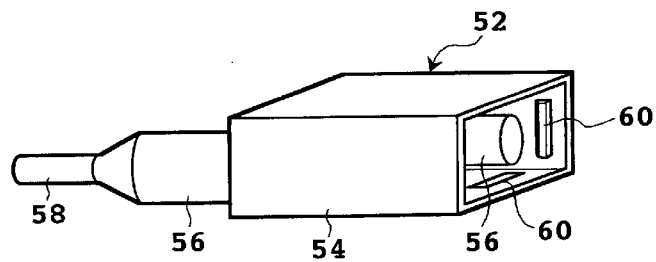
FIG. 18 is a perspective view of the optical connector shown in FIG. 17, showing its internal structure.

Referring to FIG. 17, there is shown a perspective view showing a connection structure between an optical module 2C' according to the present invention and an optical connector 52. The optical module 2C' shown in FIG. 17 is obtained by forming recesses 50 on the molded epoxy resin 24 of the optical module 2C according to the third preferred embodiment. The recesses 50 may be formed in molding the liquid epoxy resin 24. As shown in FIG. 18, the optical connector 52 has a housing 54 whose inner surface is formed with projections 60 for respectively engaging the recesses 50 of the optical module 2C'. The optical connector 52 further has a ferrule 56 connected to an optical fiber 58. The coating of the optical fiber 58 is removed at an end portion thereof to obtain a bare fiber, which is inserted and fixed in the ferrule 56.

When the optical connector 52 is engaged with the optical module 2C', the ferrule 56 of the optical connector 52 is inserted into the guide hole 38 of the optical module 2C' until the front end of the ferrule 56 abuts against the convex portion 18a of the silicone resin 18. In this condition, the projections 60 of the optical connector 52 are engaged with the recesses 50 of the optical module 2C'. By the engagement of the projections 60 and the recesses 50, it is possible to prevent disengagement of the optical connector 52 from the optical module 2C' in spite of application of some tensile force to the optical connector 52.

Figure 19:
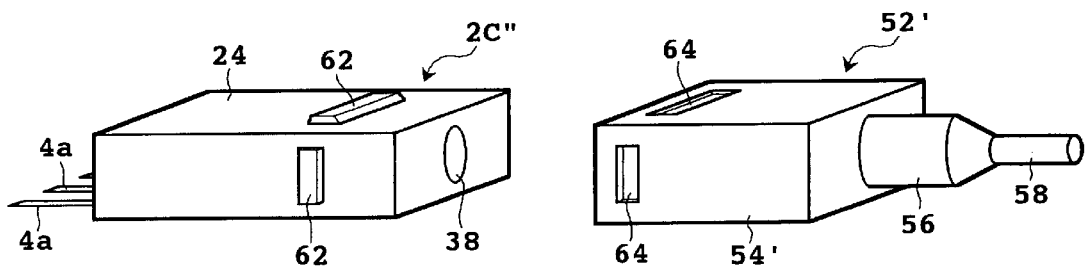
FIG. 19 is a perspective view showing another connection structure between an optical module according to the present invention and an optical connector.

Referring to FIG. 19, there is shown a perspective view showing another connection structure between an optical module 2C'' according to the present invention and an optical connector 52I. The optical module 2C'' shown in FIG. 19 is obtained by forming projections 62 on the molded epoxy resin 24 of the optical module 2C according to the third preferred embodiment. The optical connector 52' has a housing 54 formed with holes 64 for respectively engaging the projections 62 of the optical module 2C''. Also according to this connection structure, it is possible to prevent disengagement of the optical connector 52' from the optical module 2C'' in spite of application of some tensile force to the optical connector 52' owing to the engagement of the projections 62 of the optical module 2C'' and the holes 64 of the optical connector 52'.

Figure 20:
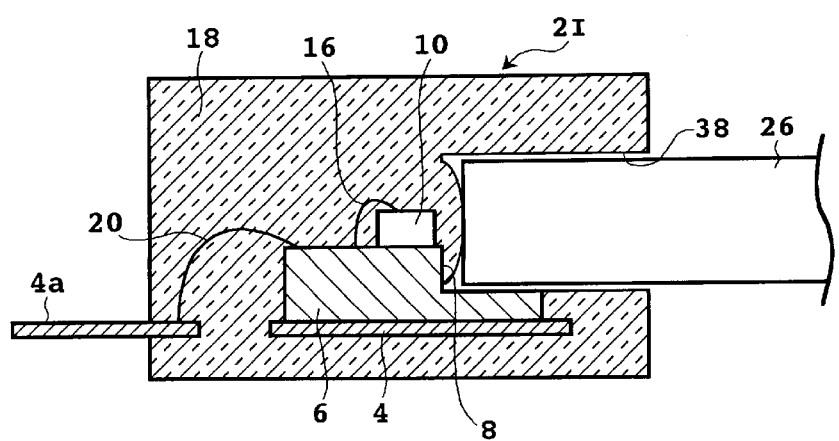
FIG. 20 is a sectional view of an optical module according to a ninth preferred embodiment of the present invention.

Referring to FIG. 20, there is shown a sectional view of an optical module 2I according to a ninth preferred embodiment of the present invention. The optical module 2I according to the ninth preferred embodiment is a modification of the optical module 2C according to the third preferred embodiment shown in FIG. 7. In the optical module 2I, the silicone resin 18 is used not only to encapsulate the optical element 10, but also to cover the whole molding area of the epoxy resin 24 used in the third preferred embodiment. In other words, the optical module 2I employs no epoxy resin to be molded. Accordingly, only one kind of resin, i.e., only the silicone resin 18, is required in this preferred embodiment, thereby easily forming the guide hole 38 for guiding insertion of the ferrule 26 of an optical connector. The substrate 6 shown in FIG. 20 is the same in configuration as the substrate 6 shown in FIG. 2.

Figure 21A:
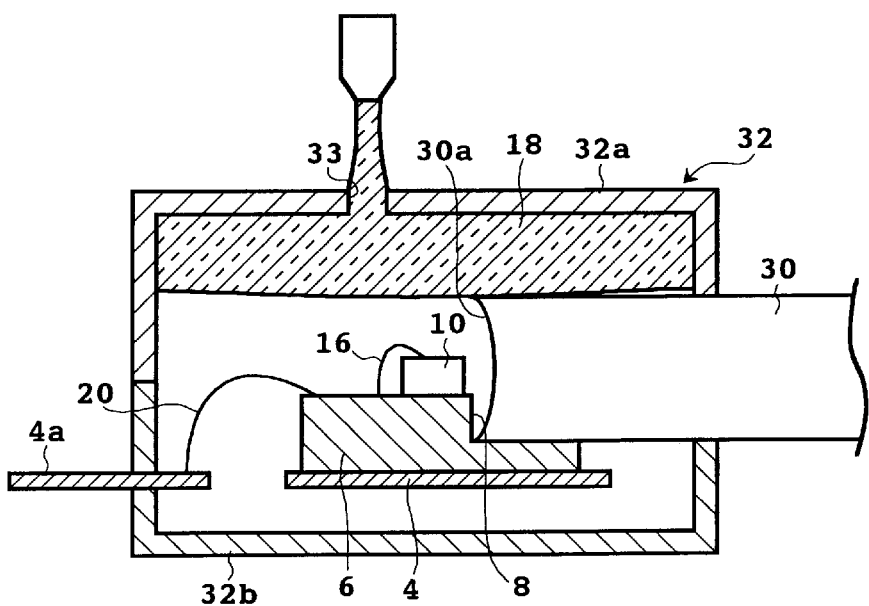
FIGS. 21A and 21B are sectional views showing a manufacturing process for the optical module according to the ninth preferred embodiment.
Figure 21B:
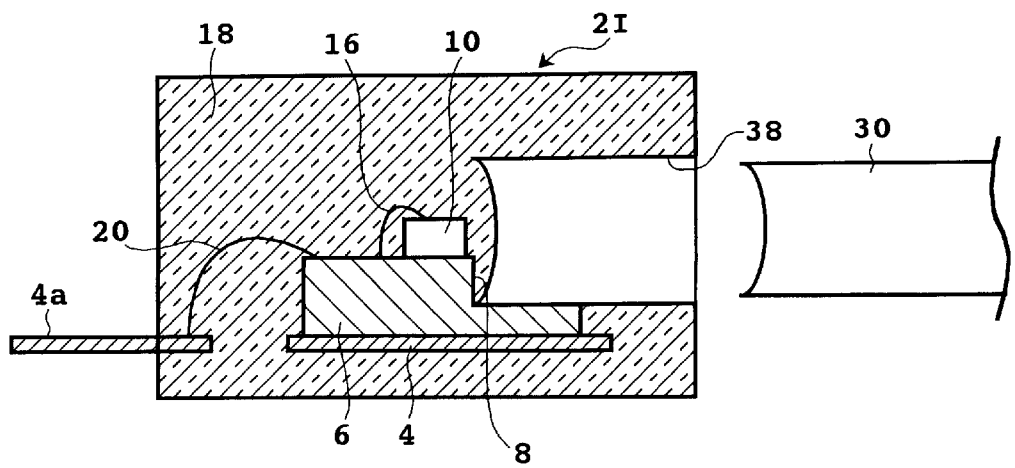

A manufacturing process for the optical module 2I according to the ninth preferred embodiment will now be described with reference to FIGS. 21A and 21B. As shown in FIG. 21A, a mold 32 consisting of an upper member 32a and a lower member 32b is set so that a core 30 is sandwiched between the upper and lower members 32a and 32b, and is placed on the substrate 6 in alignment with the optical element 10 in such a manner that the front end 30a of the core 30 abuts against the vertical portion 8 of the substrate 6. In this condition, the silicone resin 18 in a liquid state is injected into the mold 32 from the injection hole 33. After filling the inside space of the mold 32 with the silicone resin 18, the silicone resin 18 is heated to about 150° C. to about 160° C. for curing. After curing the silicone resin 18, the mold 32 and the core 30 are removed from the cured silicone resin 18 as shown in FIG. 21B. As a result, the guide hole 38 is defined by the molded silicone resin 18 to obtain the optical module 2I.

Figure 22:
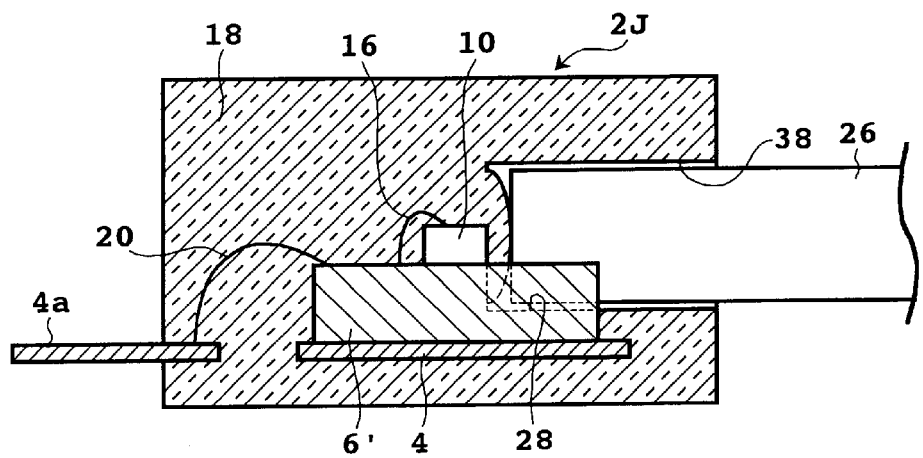
FIG. 22 is a sectional view of an optical module according to a tenth preferred embodiment of the present invention.

Referring to FIG. 22, there is shown a sectional view of an optical module 2J according to a tenth preferred embodiment of the present invention. The optical module 2J according to the tenth preferred embodiment is a modification of the optical module 2D according to the fourth preferred embodiment shown in FIG. 8. In the optical module 2J, the silicone resin 18 is used not only to encapsulate the optical element 10, but also to cover the whole molding area of the epoxy resin 24 used in the fourth preferred embodiment. In addition to the same effect as that of the ninth preferred embodiment shown in FIG. 20, the ferrule 26 can be precisely guided by the V groove 28 of the substrate 6'.

Figure 23:
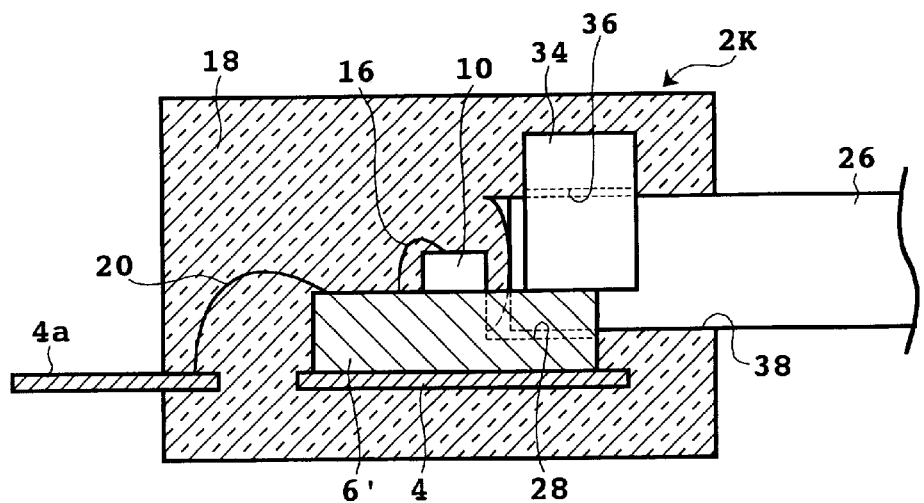
FIG. 23 is a sectional view of an optical module according to an eleventh preferred embodiment of the present invention.

Referring to FIG. 23, there is shown a sectional view of an optical module 2K according to an eleventh preferred embodiment of the present invention. The optical module 2K according to the eleventh preferred embodiment is similar to the optical module 2E according to the fifth preferred embodiment shown in FIG. 10. In the optical module 2K, the silicone resin 18 is used not only to encapsulate the optical element 10, but also to cover the whole molding area of the epoxy resin 24 used in the fifth preferred embodiment. In addition to the same effect as that of the ninth preferred embodiment shown in FIG. 20, the ferrule 26 can be precisely guided by the V groove 28 of the substrate 6' and the V groove 36 of the block 34. Furthermore, deformation of the molded silicone resin 18 due to play or the like of the ferrule 26 during insertion thereof can be prevented by the V grooves 28 and 36.

Figure 24:
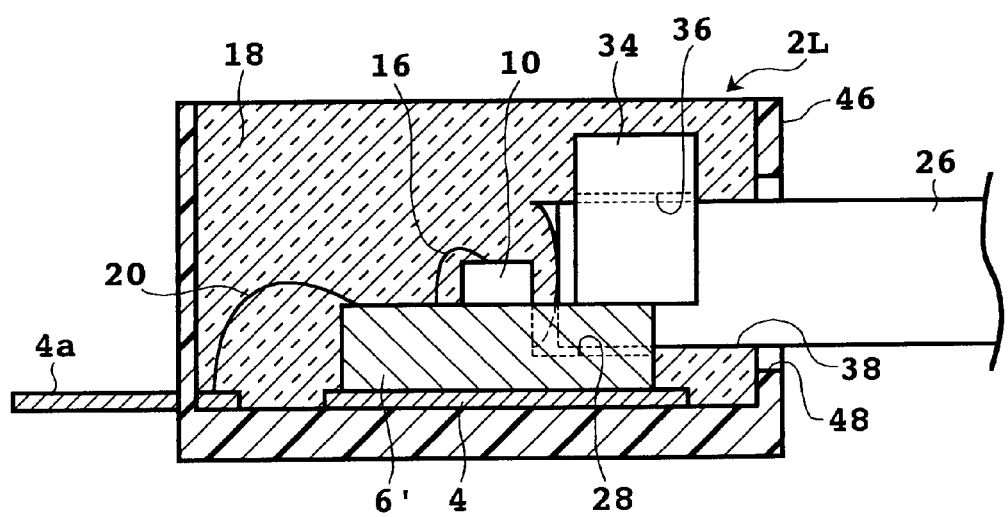
FIG. 24 is a sectional view of an optical module according to a twelfth preferred embodiment of the present invention.

Referring to FIG. 24, there is shown a sectional view of an optical module 2L according to a twelfth preferred embodiment of the present invention. The optical module 2L according to the twelfth preferred embodiment is similar to the optical module 2H according to the eighth preferred embodiment shown in FIG. 15, and differs therefrom in only the point that the inside space of the resin package 46 is filled with the cured silicone resin 18.

Figure 25A:
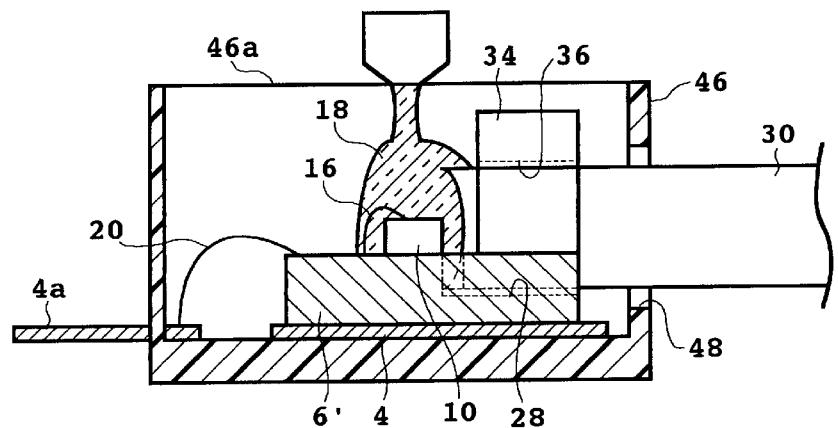
FIGS. 25A to 25C are sectional views showing a manufacturing process for the optical module according to the twelfth preferred embodiment.

A manufacturing process for the optical module 2L according to the twelfth preferred embodiment will now be described with reference to FIGS. 25A to 25C. As shown in FIG. 25A, a lead frame 4 having a plurality of leads 4a is fixed in a resin package 46 having an upper opening 46a and a side opening 48. A substrate 6' having a V groove 28 is preliminarily mounted on the lead frame 4, and an optical element 10 is preliminarily mounted on the substrate 6'. A core 30 is inserted through the side opening 48 of the resin package 46, and is placed in the V groove 28 of the substrate 6'. Further, a block 34 having a V groove 36 is fixed to the substrate 6' so that the core 30 is sandwiched between the V groove 46 of the block 34 and the V groove 28 of the substrate 6'.

Figure 25B:
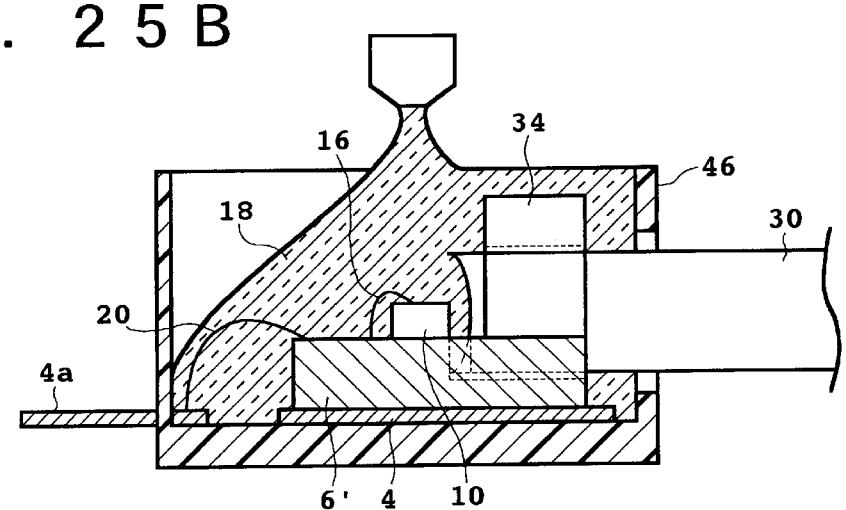
Figure 25C:
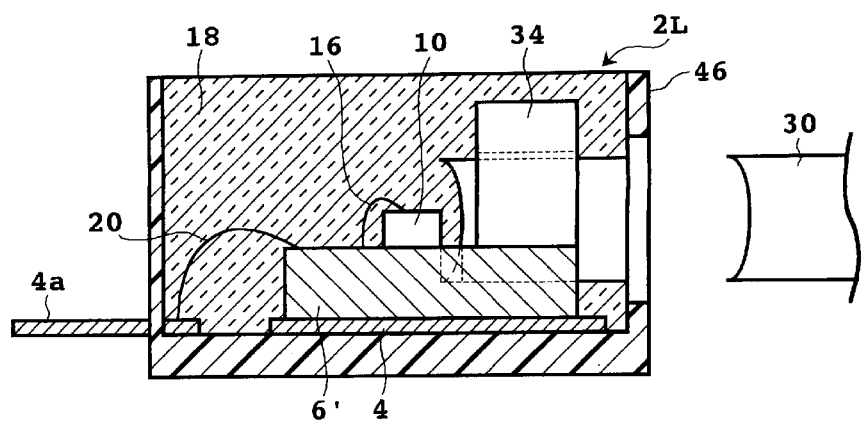

As shown in FIGS. 25A and 25B, a silicone resin 18 in a liquid state is poured into the resin package 46 to fill the inside space of the resin package 46. Then, the silicone resin 18 is heated to about 150° C. to about 160° C. for curing. As a result, the resin package 46 and the cured silicone resin 18 are integrated together. Thereafter, the core 30 is drawn out of the cured silicone resin 18 through the side opening 48 of the resin package 46 as shown in FIG. 25C, thus obtaining the optical module 2L having a configuration such that the resin package 46 and the cured silicone resin 18 are integrated together.

Figure 26:
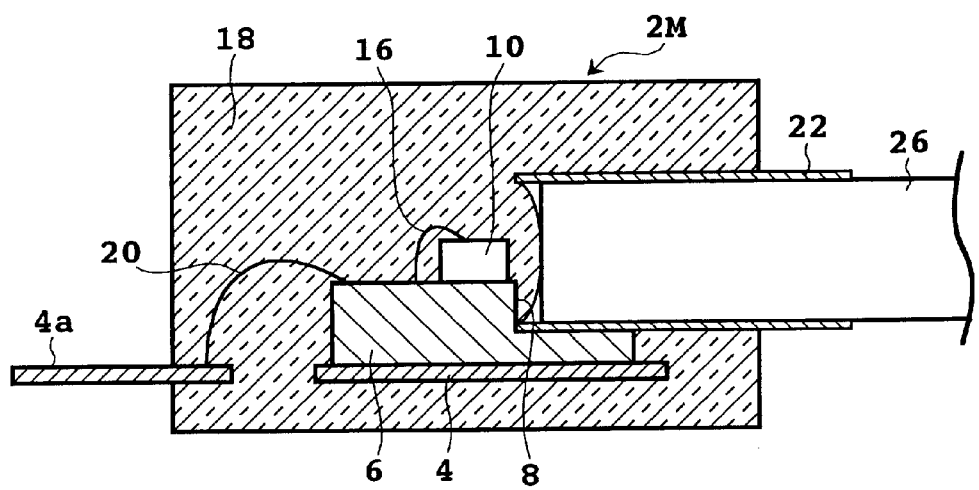
FIG. 26 is a sectional view of an optical module according to a thirteenth preferred embodiment of the present invention.

Referring to FIG. 26, there is shown a sectional view of an optical module 2M according to a thirteenth preferred embodiment of the present invention. The optical module 2M according to the thirteenth preferred embodiment is similar to the optical module 2A according to the first preferred embodiment shown in FIG. 1, and differs therefrom in only the point that the silicone resin 18 is used not only to encapsulate the optical element 10, but also to cover the whole molding area of the epoxy resin 24 used in the first preferred embodiment. By the use of the silicone resin 18 only, the connection structure to the ferrule 26 of an optical connector can be easily obtained.

Figure 27A:
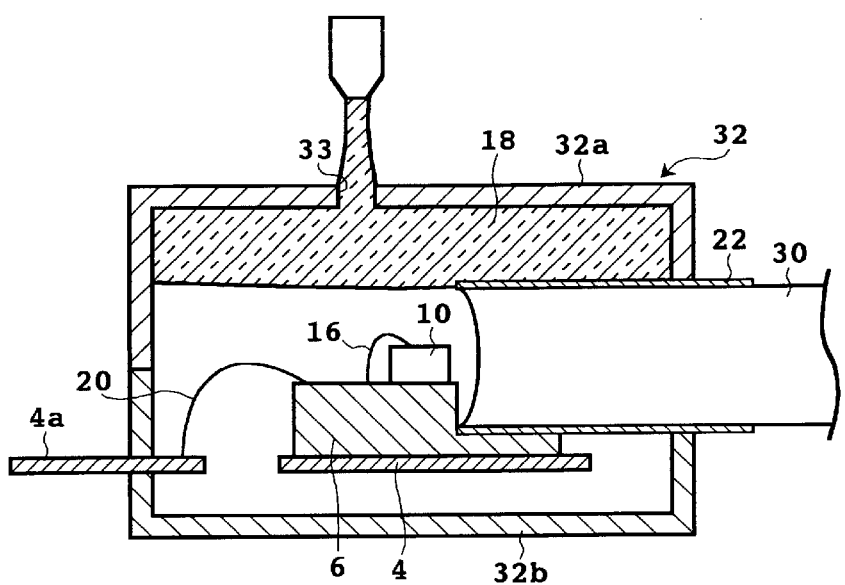
FIGS. 27A and 27B are sectional views showing a manufacturing process for the optical module according to the thirteenth preferred embodiment.
Figure 27B:
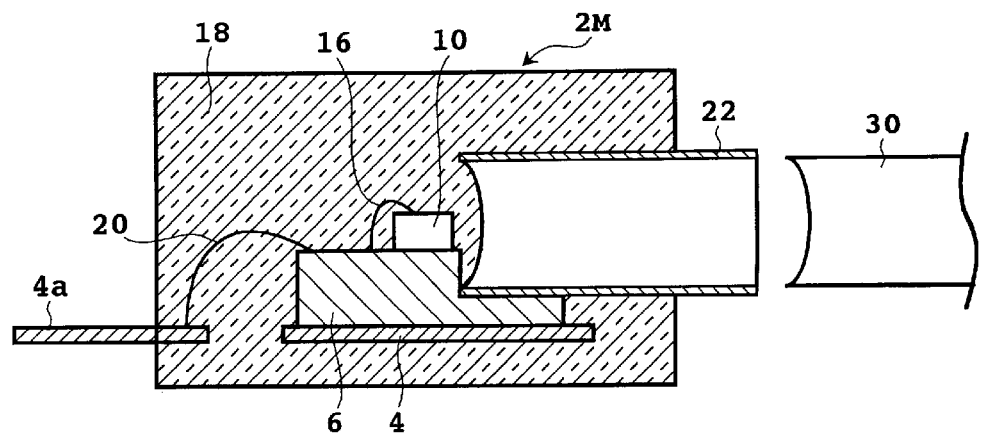

A manufacturing process for the optical module 2M according to the thirteenth preferred embodiment will now be described with reference to FIGS. 27A and 27B. As shown in FIG. 27A, a core 30 is inserted into a sleeve 22, and a mold 32 consisting of an upper member 32a and a lower member 32b is set so that the sleeve 22 is sandwiched between the upper and lower members 32a and 32b of the mold 32. It is preferable to preliminarily apply a releasing agent to the inner surface of the mold 32. In this condition, a silicone resin 18 in a liquid state is injected into the mold 32 from the injection hole 33 to fill the inside space of the mold 32. Thereafter, the silicone resin 18 is heated to about 150° C. to about 160° C. for curing. After curing the silicone resin 18, the mold 32 is removed from the cured silicone resin 18, and the core 30 is drawn out of the sleeve 22 as shown in FIG. 27B. Then, the leads 4a are cut off from the outer peripheral portion (not shown) of the lead frame 4 to separate the leads 4a from each other, thus obtaining the optical module 2M having the molded silicone resin 18 encapsulating all the components except a part of each of the leads 4a and a part of the sleeve 22.

Figure 28:
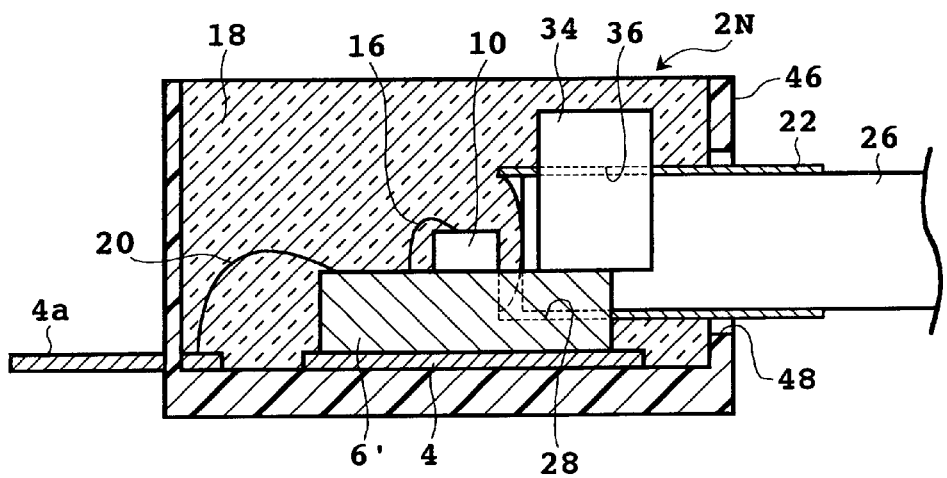
FIG. 28 is a sectional view of an optical module according to a fourteenth preferred embodiment of the present invention.

Referring to FIG. 28, there is shown a sectional view of an optical module 2N according to a fourteenth preferred embodiment of the present invention. The optical module 2N according to this preferred embodiment is similar to the optical module 2G according to the seventh preferred embodiment shown in FIG. 13, and differs therefrom in only the point that the inside space of the resin package 46 is filled with a cured silicone resin 18.

Figure 29:
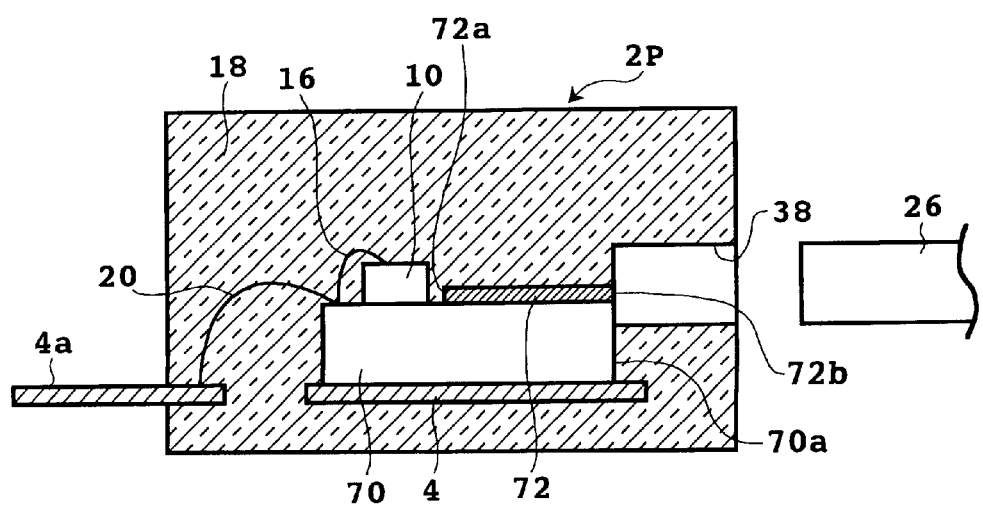
FIG. 29 is a sectional view of an optical module according to a fifteenth preferred embodiment of the present invention.

Referring to FIG. 29, there is shown a sectional view of an optical module 2P according to a fifteenth preferred embodiment of the present invention. A silicon substrate 70 is fixedly mounted on the lead frame 4 by adhesion or the like. An optical waveguide 72 is formed on the silicon substrate 70. An optical element 10 for making conversion between light and electricity, such as a laser diode or a photodiode, is mounted on the silicon substrate 70 so as to be optically coupled to one end 72a of the optical waveguide 72.

All of the lead frame 4, the substrate 70, the optical waveguide 72, and the optical element 10 except a part of each of the leads 4a are enclosed in a molded silicone resin 18. The silicone resin 18 has transparency to an optical signal to be transmitted or received by the optical element 10. A guide hole 38 for receiving a ferrule 26 is defined in the silicone resin 18. The guide hole 38 extends between an end surface 18b of the silicone resin 18 and the other end 72b of the optical waveguide 72. Accordingly, in the condition that the ferrule 26 is fully inserted in the guide hole 38 so as to abut against an end surface 70a of the substrate 70 flush with the other end 72b of the optical waveguide 72, an optical fiber inserted in the ferrule 26 is efficiently optically coupled to the optical waveguide 72.

Figure 30:
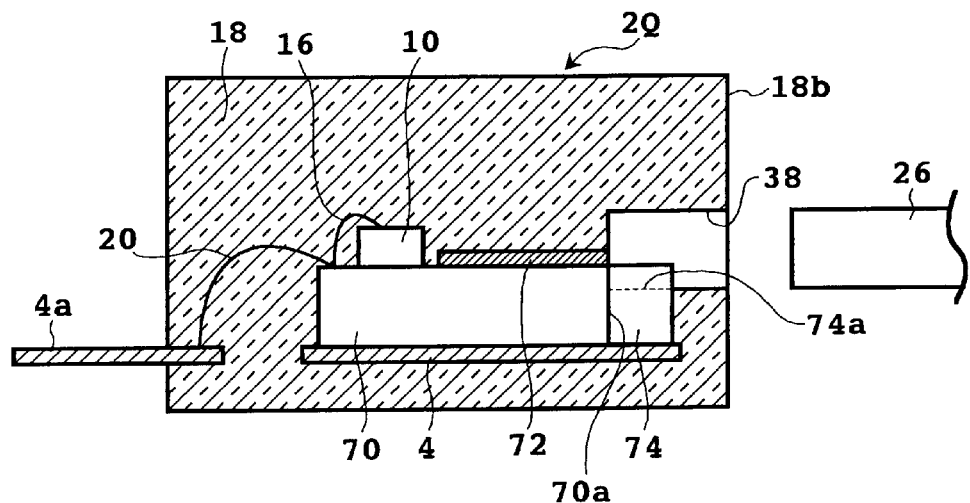
FIG. 30 is a sectional view of an optical module according to a sixteenth preferred embodiment of the present invention.

Referring to FIG. 30, there is shown a sectional view of an optical module 2Q according to a sixteenth preferred embodiment of the present invention. This preferred embodiment differs from the fifteenth preferred embodiment shown in FIG. 29 in only the point that a block 74 having a V groove 74a for facilitating the guide operation of the guide hole 38 is fixed by adhesion to the end surface 70a of the substrate 70. Alternatively, the block 74 may be fixed by adhesion to the lead frame 4. By the use of the block 74 having the V groove 74a, the ferrule 26 can be precisely guided by the V groove 74a of the block 74, thereby achieving high-efficiency optical coupling between the optical waveguide 72 and the optical fiber inserted in the ferrule 26.

Figure 31:
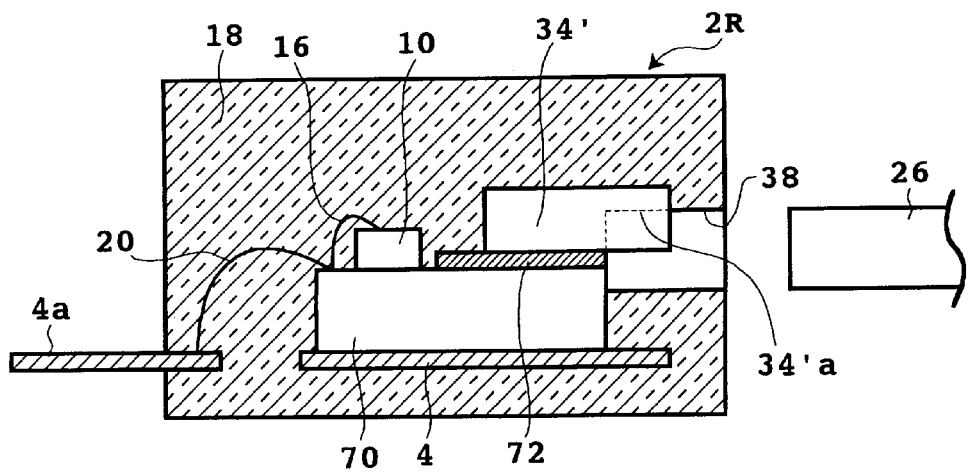
FIG. 31 is a sectional view of an optical module according to a seventeenth preferred embodiment of the present invention.

Referring to FIG. 31, there is shown a sectional view of an optical module 2R according to a seventeenth preferred embodiment of the present invention. This preferred embodiment differs from the fifteenth preferred embodiment shown in FIG. 29 in only the point that a block 34' having a V groove 34'a for facilitating the guide operation of the guide hole 38 is mounted on the substrate 70. As similar to the sixteenth preferred embodiment shown in FIG. 30, the ferrule 26 can be precisely guided by the V groove 34'a of the block 34, thereby achieving high-efficiency optical coupling between the optical waveguide 72 and the optical fiber inserted in the ferrule 26.

Figure 32:
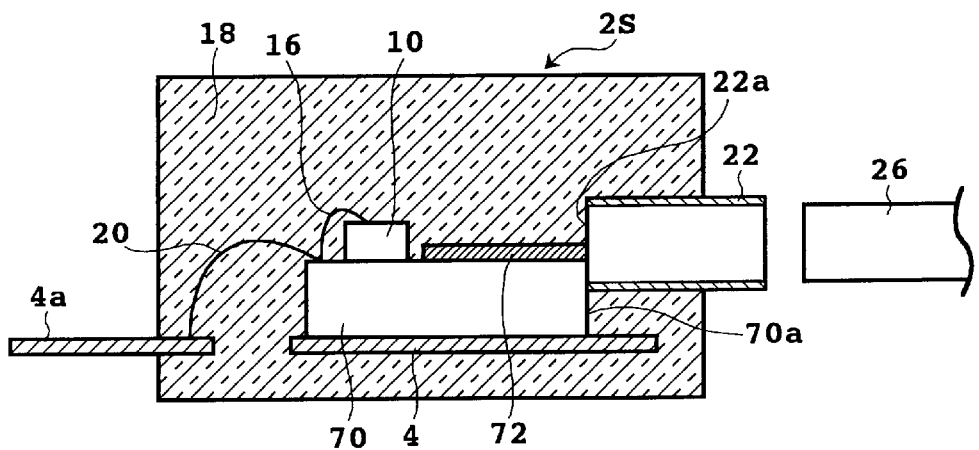
FIG. 32 is a sectional view of an optical module according to an eighteenth preferred embodiment of the present invention.

Referring to FIG. 32, there is shown an optical module 2S according to an eighteenth preferred embodiment of the present invention. In this preferred embodiment, a sleeve 22 for guiding the ferrule 26 is partially embedded in the molded silicone resin 18 in such a manner that the front end 22a of the sleeve 22 abuts against the end surface 70a of the substrate 70. The other configuration is similar to that of the optical module 2P shown in FIG. 29. Also according to this preferred embodiment, the ferrule 26 can be precisely guided by the sleeve 22, thereby achieving high-efficiency optical coupling between the optical waveguide 72 and the optical fiber inserted in the ferrule 26.

Figure 33:
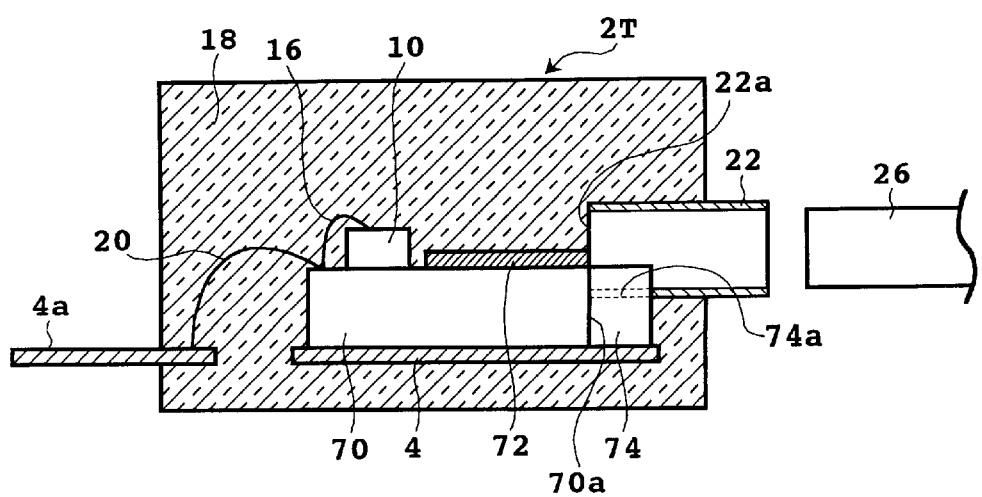
FIG. 33 is a sectional view of an optical module according to a nineteenth preferred embodiment of the present invention.

Referring to FIG. 33, there is shown a sectional view of an optical module 2T according to a nineteenth preferred embodiment of the present invention. In this preferred embodiment, a block 74 having a V groove 74a is fixed by adhesion to the end surface 70a of the substrate 70 or to the lead frame 4, and a sleeve 22 is placed in the V groove 74a of the block 74 so that the front end 22a of the sleeve 22 abuts against the end surface 70a of the substrate 70. Also according to this preferred embodiment, the ferrule 26 can be precisely guided by the sleeve 22, thereby achieving high-efficiency optical coupling between the optical waveguide 72 and the optical fiber inserted in the ferrule 26.

Figure 34:
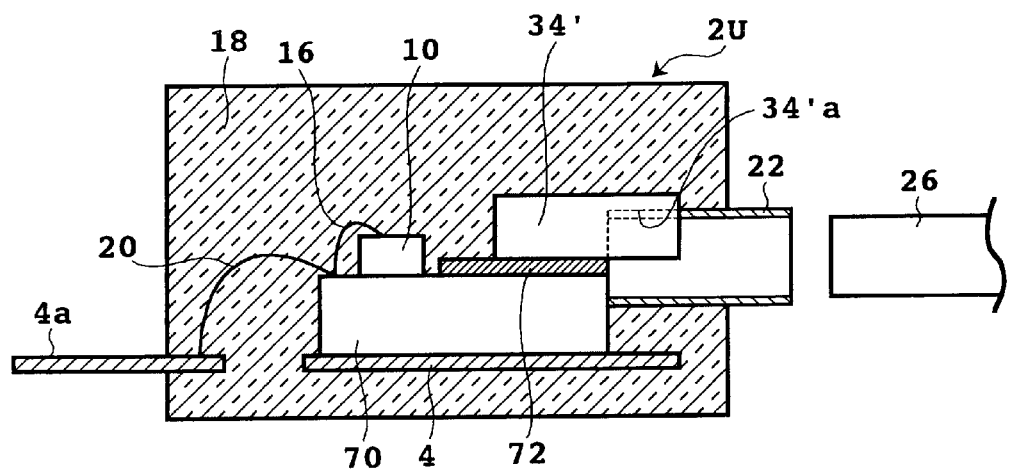
FIG. 34 is a sectional view of an optical module according to a twentieth preferred embodiment of the present invention.

Referring to FIG. 34, there is shown a sectional view of an optical module 2U according to a twentieth preferred embodiment of the present invention. In this preferred embodiment, a block 34' having a V groove 34'*a* is mounted on the substrate 70, and a sleeve 22 is placed in the V groove 34'*a* of the block 34'. Also according to this preferred embodiment, the ferrule 26 can be precisely guided by the sleeve 22, thereby achieving high-efficiency optical coupling between the optical waveguide 72 and the optical fiber inserted in the ferrule 26.

Figure 35:
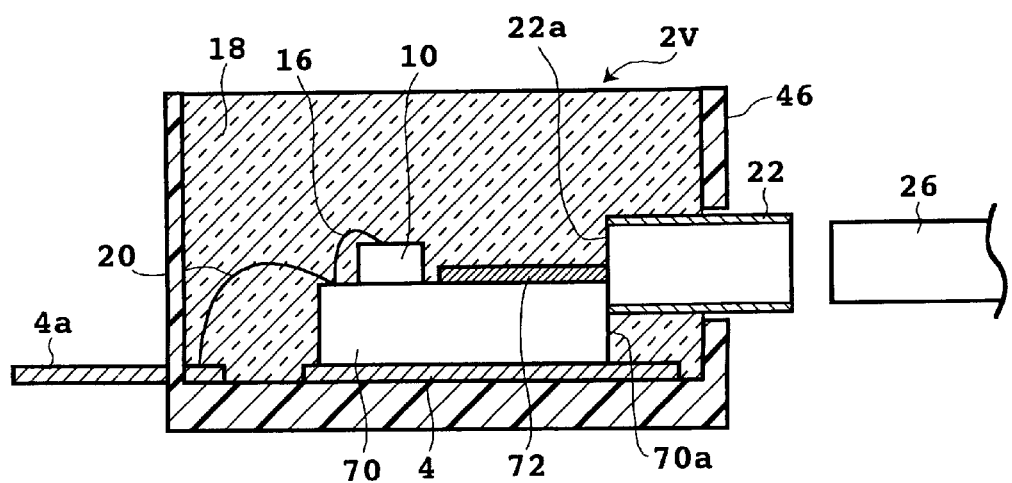
FIG. 35 is a sectional view of an optical module according to a twenty-first preferred embodiment of the present invention.

Referring to FIG. 35, there is shown a sectional view of an optical module 2V according to a twenty-first preferred embodiment of the present invention. In this preferred embodiment, a silicone resin 18 is poured into a resin package 46 and cured to be integrated with the resin package 46. The resin package 46 may be replaced by a metal package. According to this preferred embodiment, a sleeve 22 is partially embedded in the cured silicone resin 18 so that the front end 22*a* of the sleeve 22 abuts against the end surface 70*a* of the substrate 70. Accordingly, the ferrule 26 can be precisely guided by the sleeve 22, thereby achieving high-efficiency optical coupling between the optical waveguide 72 and the optical fiber inserted in the ferrule 26.

Figure 36:
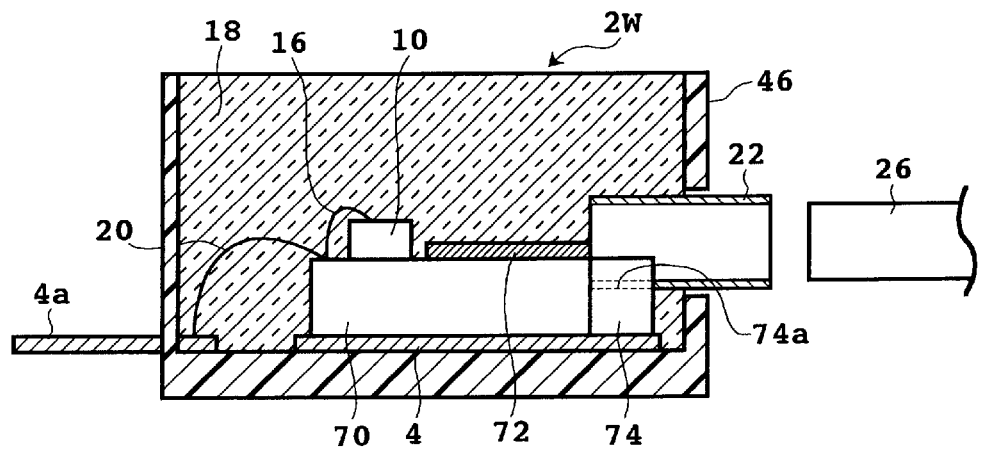
FIG. 36 is a sectional view of an optical module according to a twenty-second preferred embodiment of the present invention.

Referring to FIG. 36, there is shown a sectional view of an optical module 2W according to a twenty-second preferred embodiment of the present invention. This preferred embodiment is similar to the optical module 2U shown in FIG. 35, and differs therefrom in only the point that a block 74 having a V groove 74*a* for positioning the sleeve 22 is used. Accordingly, the ferrule 26 can be precisely guided by the sleeve 22, thereby achieving high-efficiency optical coupling between the optical waveguide 72 and the optical fiber inserted in the ferrule 26.

Figure 37:
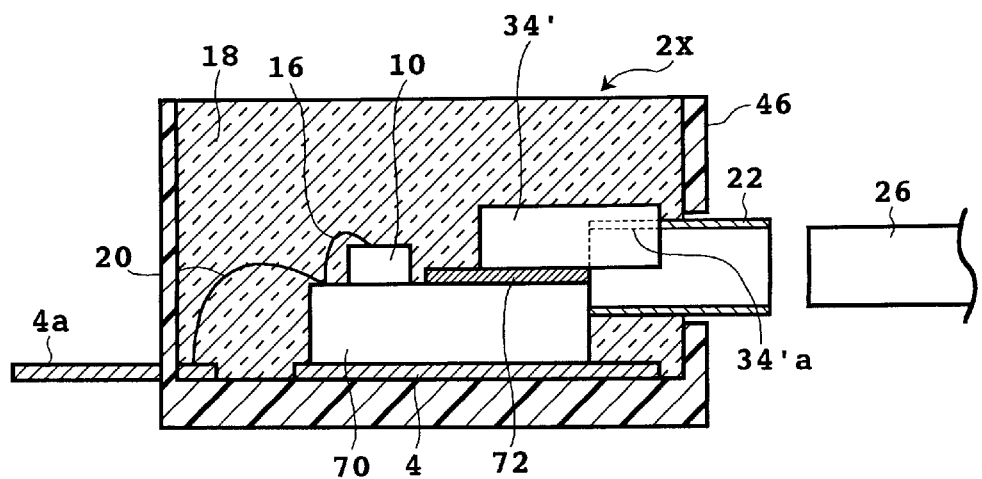
FIG. 37 is a sectional view of an optical module according to a twenty-third preferred embodiment of the present invention.

Referring to FIG. 37, there is shown a sectional view of an optical module 2X according to a twenty-third preferred embodiment of the present invention. This preferred embodiment is similar to the optical module 2U shown in FIG. 35, and differs therefrom in only the point that a block 34' having a V groove 34'*a* for positioning the sleeve 22 is mounted on the substrate 70 is used. Accordingly, the ferrule 26 can be precisely guided by the sleeve 22, thereby achieving high-efficiency optical coupling between the optical waveguide 72 and the optical fiber inserted in the ferrule 26.

According to the present invention as described above, all the components of the optical module including the optical element and the substrate are enclosed in the molded resin, and the guide hole for guiding insertion of the ferrule 26 of an optical connector for connection with an optical fiber transmission line is formed in the molded resin. Accordingly, it is possible to provide a low-cost, high-reliability optical module.

What is claimed is:

1. An optical module comprising:
   a plurality of leads;
   a substrate having a plurality of conductive patterns electrically connected to said leads;
   an optical element mounted on said substrate for making conversion between light and electricity;
   a first resin for encapsulating said optical element, said first resin having transparency to said light; and
   a second resin for enclosing all of said leads, said substrate, said optical element, and said first resin except a part of each of said leads;
   said second resin being formed with a hole for receiving a ferrule, so as to optically couple an optical fiber inserted in said ferrule through said first resin to said optical element, said hole being closed by said first resin.

2. An optical module according to claim 1, wherein said substrate has a V groove for guiding said ferrule to said optical element.

3. An optical module according to claim 1, wherein:
   said substrate has a first V groove; and
   said optical module further comprises a block fixed to said substrate, said block having a second V groove opposed to said first V groove of said substrate;
   said first V groove of said substrate and said second V groove of said block cooperating to guide said ferrule to said optical element.

4. An optical module according to claim 1, further comprising a sleeve inserted in said hole, for guiding said ferrule to said optical element.

5. An optical module according to claim 1, further comprising a package having an upper opening, said second resin being molded in said package.

6. An optical module according to claim 1, wherein said first resin comprises a silicone resin, and said second resin comprises an epoxy resin.

7. A manufacturing method for an optical module, comprising the steps of:
   providing a lead frame having a plurality of leads;
   mounting a substrate having a plurality of conductive patterns on said lead frame;
   mounting an optical element for making conversion between light and electricity on said substrate;
   placing a sleeve having a front end on said substrate so that said front end is adjacent to said optical element;
   inserting a core having a front end into said sleeve until said front end of said core comes to said front end of said sleeve;
   applying a first resin in a liquid state to said optical element so as to fully cover said optical element, said first resin having transparency to said light;
   curing said first resin to encapsulate said optical element and close said front end of said sleeve;
   connecting said conductive patterns through a plurality of wires to said leads, respectively;
   providing a mold enclosing all of said substrate, said optical element, said sleeve, said first resin cured, said wires, and said lead frame except a part of said sleeve and a part of each of said leads;
   injecting a second resin in a liquid state into said mold to fill said mold with said second resin;
   curing said second resin; and
   removing said mold from said second resin cured and drawing said core out of said sleeve.

8. A manufacturing method according to claim 7, wherein said substrate has a V groove, said placing step comprising the step of placing said sleeve in said V groove of said substrate.

9. A manufacturing method for an optical module, comprising the steps of:
   providing a lead frame having a plurality of leads;
   mounting a substrate having a plurality of conductive patterns on said lead frame;
   mounting an optical element for making conversion between light and electricity on said substrate;
   placing a core having a front end on said substrate so that said front end of said core is adjacent to said optical element;
   applying a first resin in a liquid state to said optical element so as to fully cover said optical element, said first resin having transparency to said light;

curing said first resin to encapsulate said optical element;

connecting said conductive patterns through a plurality of wires to said leads, respectively;

providing a mold enclosing all of said substrate, said optical element, said first resin cured, said wires, and said lead frame except a part of said core and a part of each of said leads;

injecting a second resin in a liquid state into said mold to fill said mold with said second resin;

curing said second resin; and removing said mold and said core from said second resin cured.

10. A manufacturing method according to claim 9, wherein said substrate has a V groove, said placing step comprising the step of placing said core in said V groove of said substrate.

11. A manufacturing method for an optical module, comprising the steps of:

providing a package having an upper opening and a side opening;

fixing a lead frame having a plurality of leads in said package so that a part of each of said leads projects out of said package;

mounting a substrate having a plurality of conductive patterns on said lead frame;

mounting an optical element for making conversion between light and electricity on said substrate;

inserting a sleeve having a front end through said side opening of said package to place said sleeve on said substrate so that said front end is adjacent to said optical element;

inserting a core having a front end into said sleeve until said front end of said core comes to said front end of said sleeve;

applying a first resin in a liquid state to said optical element so as to fully cover said optical element, said first resin having transparency to said light;

curing said first resin to encapsulate said optical element and close said front end of said sleeve;

connecting said conductive patterns through a plurality of wires to said leads, respectively;

pouring a second resin in a liquid state into said package from said upper opening to fill said package with said second resin;

curing said second resin; and drawing said core out of said sleeve.

12. A manufacturing method according to claim 11, wherein said substrate has a V groove, said placing step comprising the step of placing said sleeve in said V groove of said substrate.

13. A manufacturing method for an optical module, comprising the steps of:

providing a package having an upper opening and a side opening;

fixing a lead frame having a plurality of leads in said package so that a part of each of said leads projects out of said package;

mounting a substrate having a plurality of conductive patterns on said lead frame;

mounting an optical element for making conversion between light and electricity on said substrate;

inserting a core having a front end through said side opening of said package to place said core on said substrate so that said front end is adjacent to said optical element;

applying a first resin in a liquid state to said optical element so as to fully cover said optical element, said first resin having transparency to said light;

curing said first resin to encapsulate said optical element;

connecting said conductive patterns through a plurality of wires to said leads, respectively;

pouring a second resin in a liquid state into said package from said upper opening to fill said package with said second resin;

curing said second resin; and drawing said core out of said second resin cured.

14. A manufacturing method according to claim 13, wherein said substrate has a V groove, said placing step comprising the step of placing said core in said V groove of said substrate.

15. An optical module comprising:

a plurality of leads;

a substrate having a plurality of conductive patterns electrically connected to said leads;

an optical element mounted on said substrate for making conversion between light and electricity; and a resin for enclosing said leads, said substrate, and said optical element except a part of each of said leads, said resin having transparency to said light, said resin being formed with a hole for receiving a ferrule, so as to optically couple an optical fiber inserted in said ferrule through said resin to said optical element.

16. An optical module according to claim 15, wherein said substrate has a V groove for guiding said ferrule to said optical element.

17. An optical module according to claim 15, wherein:

said substrate has a first V groove; and said optical module further comprises a block fixed to said substrate, said block having a second V groove opposed to said first V groove of said substrate;

said first V groove of said substrate and said second V groove of said block cooperating to guide said ferrule to said optical element.

18. An optical module according to claim 15, further comprising a sleeve inserted in said hole, for guiding said ferrule to said optical element.

19. An optical module according to claim 15, further comprising a package having an upper opening, said resin being molded in said package.

20. An optical module according to claim 15, further comprising an optical waveguide formed on said substrate for optically coupling said optical element and said optical fiber.

21. An optical module according to claim 20, further comprising a block fixed to said substrate, said block having a V groove for guiding said ferrule to said optical element.

* * * * *